United States Patent [19]

Sakamoto et al.

[11] Patent Number: 5,194,741

[45] Date of Patent: Mar. 16, 1993

[54] METHOD FOR WRITING A PATTERN ON AN OBJECT BY A FOCUSED ELECTRON BEAM WITH AN IMPROVED EFFICIENCY

[75] Inventors: Kiichi Sakamoto; Yoshihisa Oae; Junko Hatta; Yasushi Takahashi, all of Kawasaki, Japan

[73] Assignee: Fujitsu Limited, Kawasaki, Japan

[21] Appl. No.: 855,108

[22] Filed: Mar. 20, 1992

[30] Foreign Application Priority Data

Mar. 20, 1991 [JP] Japan ................................. 3-57423

[51] Int. Cl.$^5$ ............................................ H01J 37/302
[52] U.S. Cl. ............................... 250/492.2; 250/492.3; 250/400
[58] Field of Search ................. 250/492.2 R, 492.22, 250/492.3, 492.1, 396 R, 398, 400

[56] References Cited

U.S. PATENT DOCUMENTS

| | | | |
|---|---|---|---|
| 4,117,340 | 9/1978 | Goto et al. | 250/400 |
| 4,950,910 | 8/1990 | Yasuda et al. | 250/492.3 |
| 5,030,836 | 7/1991 | Kusui et al. | 250/492.22 |
| 5,083,032 | 1/1992 | Suzuki | 250/492.2 |

Primary Examiner—Jack I. Berman
Assistant Examiner—James Beyer
Attorney, Agent, or Firm—Staas & Halsey

[57] ABSTRACT

A method for writing a pattern on a surface of an object by a focused electron beam with a minimized distortion of the electron beam comprises the steps of dividing the surface of the object into a plurality of parallel bands, moving the object in a direction perpendicular to the bands with a predetermined speed, achieving an exposure of the device pattern on an individual, band by band basis while moving the object with the predetermined speed. The predetermine speed is optimized with respect to an exposure interval representing a time interval in which the exposure of the band is possible. In order to minimize the distortion of the electron beam, the timing of the exposure of each band in each exposure interval is adjusted by (a) detecting a critical timing pattern that determines the optimized moving speed, (b) shifting the corresponding timing of exposure for each band, starting from the band immediately before the critical timing pattern and proceeding in a direction to the first band, such that the timing of exposure is shifted toward the center of the exposure interval to the extent that the exposure of any given band does not overlap the exposure of the next preceding band, and (c) repeating the step (b) for each of the remaining bands of the plurality of bands until the respective timing of exposure of each band reaches the center of the corresponding exposure interval.

8 Claims, 17 Drawing Sheets

○ : START EXPOSURE
● : END EXPOSURE

TYPE 1

TYPE 2

TYPE 3

TYPE 4

TYPE 5

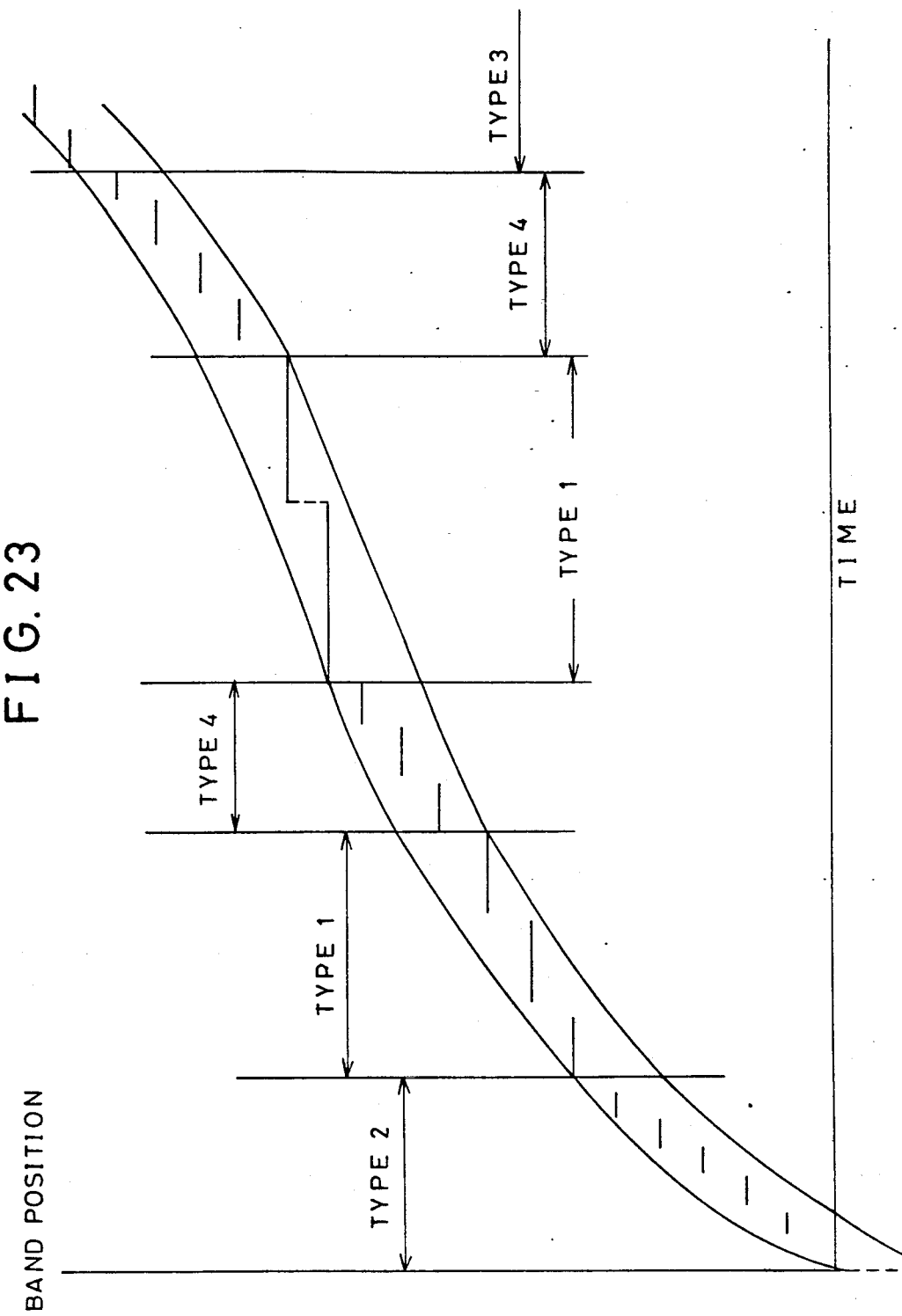

METHOD FOR WRITING A PATTERN ON AN OBJECT BY A FOCUSED ELECTRON BEAM WITH AN IMPROVED EFFICIENCY

BACKGROUND OF THE INVENTION

The present invention generally relates to semiconductor devices, and more particularly to a process for writing a semiconductor pattern on a substrate by a focused electron beam.

The submicron patterning process is one of the most important targets in the current fabrication technology of semiconductor integrated circuits. With the submicron patterning, one can increase the operational speed of logic devices significantly. In the semiconductor memories, on the other hand, the increase of the integration density associated with the submicron patterning directly relates to the increase of storage capacity of information.

In the optical exposure process used conventionally in the patterning of semiconductor devices, a pattern size of about 0.3 $\mu$m sets the lower limit that can be achieved even though combined with the phase shift mask. On the other hand, the electron beam exposure system can write a pattern on a semiconductor substrate with a pattern size of 0.1 $\mu$m or less. There, one can achieve a pattern alignment with an error of less than 0.05 $\mu$m. Thus, the electron beam exposure system is expected to become a key facility in the fabrication of future integrated circuits and various quantum devices that use the quantum mechanical effect of electrons and holes.

In the electron beam exposure system, on the other hand, there exits a problem, arising from the principle of the exposure, in that the throughput is low as compared with the optical exposure systems. It should be noted that, in the electron beam exposure systems, one has to write a device pattern on the substrate by deflecting a single electron beam. In order to accelerate the speed of exposure, various proposals have been made so far, including the use of the block exposure process wherein the electron beam is shaped variously by passing through a stencil mask or the use of the blanking aperture array wherein the electron beam is shaped into a dot pattern corresponding to the device pattern by passing through a blanking aperture array.

In the final stage of the electron beam exposure process, the electron beam thus shaped is focused on the surface of a substrate or wafer by an objective lens and causes a chemical reaction in an electron beam resist that is applied on the surface of the substrate. In this process, the electron beam is deflected to a desired location of the substrate surface. It should be noted that the range of deflection of the electron beam is limited typically on the order of several millimeters and thus a dimension which is much smaller than the size of the substrate. Thus, the exposure of the substrate is achieved by dividing the surface of the substrate into a number of strip-like zones extending parallel with each other with a width of a few millimeters and transporting the substrate in the elongated direction of the strip-like zones.

The deflection of the electron beam is achieved by energizing an electromagnetic deflector and an electrostatic deflector, wherein the electromagnetic deflector covers a range of several millimeters while the electrostatic deflector can cover only a range of several hundred microns. In exchange, the electromagnetic deflector exhibits a relatively slow response due to the delay caused by the inductance, while the electrostatic deflector exhibits a very fast response.

In the foregoing deflection process, each zone is divided into a number of parallel bands extending perpendicularly to the elongating direction of the zone, and each zone is divided into a number of sub-fields, wherein each zone may have a width of 2 mm and each sub-field may have a size of 100 $\mu$m × 100 $\mu$m. The exposure of the device pattern is achieved for each sub-field by deflecting the electron beam by the electrostatic deflector while moving the substrate in the elongated direction of the strip-like zones continuously. There, the jump from one sub-field to an adjacent sub-field in the band is achieved by the electromagnetic deflector.

FIG. 1 shows a conventional electron beam exposure system that achieves the foregoing exposure operation.

Referring to FIG. 1, the electron beam exposure system includes a CPU 1 and a data storage device such as a magnetic disk device 2 or a magnetic tape device 3, wherein the devices 2 and 3 are used to store pattern data corresponding to a device pattern of a semiconductor device to be written on a substrate. The CPU 1, the magnetic disk device 2 and the magnetic tape device 3 are connected commonly to a system bus 4, and the CPU 1 reads out the pattern data from the magnetic disk 2 or from the magnetic tape 3 on the system bus 4. The pattern data thus read out on the system bus 4 is then transferred via an interface circuit 5 to a data memory unit 6 and simultaneously to a stage controller 7.

The electron beam exposure system further includes an evacuated column 8 as usual, and there is provided an electron gun 9 at the top part of the column 8 for producing an electron beam. The electron beam thus produced by the electron gun 9 is focused on a substrate 18 that is held on a movable stage 17 after passing through various electron lenses 10, 12 and 15 as well as after being deflected by electrostatic deflectors 13 and 14, wherein the electron lens 15 acts as the objective lens for focusing the electron beam on the surface of the substrate 18. The deflector 11 is used for blanking control together with the electron lens 10 and a blanking aperture, not illustrated in FIG. 1, and causes the turning-on and turning-off of the electron beam. The electron lens 12 on the other hand is used in combination with the deflector 13 and a shaping slit (not illustrated) for shaping the electron beam into a desired beam shape.

The electron beam thus shaped is deflected by the electrostatic deflector 14 and is moved over the surface of the substrate 18 when focused thereon by the electron lens 15. Further, there is provided an electromagnetic deflector 16 for deflecting the focused electron beam over a wide range of the substrate surface. It should be noted that the electrostatic deflector 14 provides the deflection of the electron beam over a limited area, that is smaller than about 100 $\mu$m × 100 $\mu$m, with a high speed of about 0.6 $\mu$s/3 $\mu$m. On the other hand, the electromagnetic deflector 16 provides the deflection over a large area, as large as 1 mm × 1 mm, though with a limited speed of about 2-30 $\mu$s/100 $\mu$m.

In operation, the pattern data stored in the data memory unit 6 is read out by a pattern generator 19. The pattern data thus produced is then supplied to a pattern compensation circuit 20 that extracts a blanking control signal from the pattern data and supplies the same to the electrostatic deflector 11 via an amplifier 21. Simultaneously, the circuit 20 produces beam shape control data specifying the beam shape that is to be used for the shot. It should be noted that the beam shape control data is produced consecutively in correspondence to the shot and supplied to the ,electrostatic deflector 13 after conversion thereof to an analog signal in a D/A converter 22 and subsequent amplification by an amplifier 23. Further, in correspondence to each shot, the pattern compensation circuit 20 produces deflection control data and supplies the same to the electrostatic deflector 14 after conversion thereof to an analog signal in a D/A converter 24 and subsequent amplification in an amplifier 25. Furthermore, the pattern compensation circuit 20 produces another deflection control data and supplies the same to the electromagnetic deflector 16 after conversion thereof to an analog signal in a D/A converter 26 and subsequent amplification in an amplifier 27.

As already noted, the electrostatic deflector 14 and the electromagnetic deflector 16 cause movement of the electron beam over the surface of the substrate 18. During this deflection, the substrate 18 is moved in the X-Y plane in a predetermined direction by the stage 17 that in turn is driven by a control signal produced by the stage controller 7. Generally, the speed of movement of the stage 17 is set to a constant value. Thereby, the exposure is achieved along a number of parallel zones extending in the moving direction of the substrate 18 as shown in FIG. 2.

Referring to FIG. 2, a typical zone is represented by the shading. It should be noted that there are a number of zones defined on the surface of the substrate 18 so as to extend side by side. As already noted, the zone is divided into a number of bands that extend in the direction perpendicular to the elongated direction of the zone, and the exposure is achieved in correspondence to an exposure region 101 defined with respect to an optical axis of the electron beam exposure system as will be described later while moving the substrate as indicated by the arrow A in FIG. 2.

FIG. 3 shows an example of the division of the zone of FIG. 2 into the bands.

Referring to FIG. 3 which illustrates a part of a zone 100, the zone 100 is defined to extend in the moving direction of the substrate represented by an arrow A and includes a number of parallel bands $B_1$-$B_n$, wherein a typical band $B_i$ is represented by the shading. Each band extends in a direction perpendicular to the elongated direction of the zone 100 and has a width $b_1$-$b_n$ that may be constant or may be different for each band. The respective positions of the leading edge and the trailing edge of the band are represented as $bp_0$, $bp_1$, . . . . For example, the position of the leading edge of the band $B_i$ is represented as $bp_{i-1}$ while the position of the trailing edge of the same band $B_i$ is represented as $bp_i$. Further, each band is formed with a number of sub-fields $F_1$-$F_m$ that are aligned in the elongated direction of the band.

As already noted, the pattern is written, sub-field by sub-field, by an electron beam focused by an objective lens, wherein the electron beam is deflected inside the sub-field by the electrostatic deflector 14. On the other hand, the jump from one sub-field to a next sub-field is achieved by the electromagnetic deflector 16. During the exposure, the substrate 18 is moved in the direction A continuously. Thus, it is necessary to set the speed of movement of the substrate 18 such that the exposure of each band is completed before the band moves beyond the range that the electron beam can cover by the deflection. It should be noted that the time needed for the exposure may change in each sub-field and hence in each band, particularly in the devices that include an irregular device pattern such as microprocessors. More specifically, it will be understood that a complex pattern may need a large number of shots and hence a longer exposure time, while a simple pattern having a relatively reduced number of shots can be written in a short exposure time. In such a case, therefore, the time needed for the exposure is unpredictable unless evaluated in advance by analyzing the pattern to be written.

FIG. 4 shows an example where the exposure has failed.

Referring to FIG. 4, the vertical axis represents the position, measured in the direction A, of the bands $B_1$-$B_n$ defined on the surface of the substrate, and the horizontal axis represents the timing of the exposure of the band that is conducted in synchronization with the passage of the exposure region 101 (see FIG. 2). Further, lines s and t of FIG. 4 represents the relative movement of the foregoing exposure region 101 with respect to the bands defined on the substrate 18, wherein the line s corresponds to the leading edge of the exposure region 101 and defines the beginning of the interval in which the exposure of device pattern is possible by deflecting the electron beam under the control of the electromagnetic and electrostatic deflectors 14, 16. On the other hand, the line t corresponds to the trailing edge of the exposure region 101 and defines the end of the interval beyond which the exposure of device pattern by the deflection of the electron beam is not possible.

It should be noted that the lines s and t are separated from each other by a distance D that corresponds to the width of the exposure region 101. See FIG. 2 for setting of the exposure region 101 with respect the substrate 18. The width D may be set to about 1 mm or less in the moving direction A of the substrate, in correspondence to the range that can be covered by the deflection of the electron beam by the electromagnetic deflector without causing a substantial aberration. When the size D is set to 1 mm, the exposure region 101 includes therein about 10 bands each having a width $b_i$ of 100 $\mu$m. In a preferred example, the size D is set three times as large as the width $b_i$ of the band. It should be noted that, during the time interval of the exposure region 101 defined between the line s and the line t, one can conduct the exposure of the sub-fields $F_1$-$F_m$ of the respective bands.

In FIG. 4, it will be noted that the exposure of the band $B_1$ is achieved successfully in an interval $\Delta t_1$ beginning at a time $bt_0$ and ending at a time $bt_1$. Immediately after the exposure of the band $B_1$ is completed, the exposure of the next band $B_2$ starts as shown by an interval $\Delta t_2$. In this way, the exposure of the rest of the bands is achieved consecutively.

As can be seen in FIG. 4, the band that includes a complex pattern such as the band $B_3$ needs a longer time $\Delta t_4$ for the exposure than other bands, and the existence of such a complex band causes a delay in the timing of starting the subsequent exposure operation. Thereby, there occurs a case as in a band $B_8$ where the exposure of the band extends beyond the trailing edge t of the exposure region. In such a case, the exposure of the band cannot be completed, and the exposure operation has to be interrupted, by stopping the movement of the substrate 18. However, such a interruption of the movement of the stage 17 in response to each band is difficult and undesirable in view of the finite inertia of the stage driving system. Further, the repeated interruption and reactivation of the movement of the stage 17 may cause a problem in the alignment of the device pattern on the substrate 18.

SUMMARY OF THE INVENTION

Accordingly, it is a general object of the present invention to provide a novel and useful process for writing a pattern on an object by a focused electron beam, wherein the foregoing problems are eliminated.

Another and more specific object of the present invention is to provide a process for writing a pattern on a surface of an object by a focused electron beam while moving the object with an optimized speed with respect to the efficiency of the exposure operation.

Another object of the present invention is to provide a process for writing a pattern on a surface of an object by a focused electron beam, comprising the steps of dividing the surface of the object into a number of parallel bands extending in a predetermined direction, moving the object in a direction perpendicular to the extending direction of the bands with a predetermined speed, achieving an exposure of the device pattern one band by one band while moving the object in said direction with said predetermined speed, said predetermined speed being optimized with respect to a time interval that is needed for exposing the band by conducting an optimization process, said optimization process comprising the steps of:

(a) assuming an initial timing relationship representing a relationship between the timing of the exposure of each band and the position of the band, measured in the moving direction of the object, such that the exposure of each band is achieved consecutively, one after another and from the first band to the last band, without interruption;

(b) assuming an initial moving speed of the object;

(c) detecting, based upon the initial timing relationship, a band for which the exposure thereof precedes a predetermined exposure interval, said predetermined exposure interval being defined with respect to each band as a function of the moving speed of the object;

(d) detecting, based upon the initial timing relationship, an offset of the timing between the start of the exposure given by the initial timing relationship and the beginning of said predetermined exposure interval, for the band that has been detected in the step (c);

(e) modifying the timing relationship by delaying the timing of exposure uniformly by an amount corresponding to said offset for the detected band and the bands that follow thereto, to create a modified timing relationship that represents the modified timing of the exposure of the band;

(f) detecting, based upon the modified timing relationship, a band for which the exposure thereof continues after the end of the predetermined exposure interval, starting from the second band and proceeding consecutively to the last band;

(g) reducing said predetermined speed, when a band is detected in the step (f), such that said predetermined exposure interval is extended and such that the exposure of said band that is detected in the step (f) is finished within said extended predetermined exposure interval; and (h) repeating said steps (c)-(g) by setting the reduced moving speed as said predetermined speed and by setting said modified timing relationship as said initial timing relationship, until the timing of the exposure falls within the predetermined exposure interval for all of the bands.

According to the present invention, one can maximize the efficiency of the exposure operation while guaranteeing that there is no failure of exposure. It should be noted that the moving speed is set to a large value at the beginning of the optimization process and reduced consecutively until the optimized moving speed is achieved. In correspondence to the decrease of the moving speed, the predetermined exposure interval is extended consecutively. By deflecting the electron beam in accordance with the optimized moving speed of the object during the exposure of the bands, one can increase the predetermined exposure interval. Thereby, a large optimized moving speed is obtained.

Another object of the present invention is to provide a process for optimizing a timing of exposure of the bands within a given exposure interval that is determined by an optimized moving speed of the substrate, such that the exposure of the bands is achieved as close as possible to the center of the exposure interval. According to the present invention, one can minimize the deformation of electron beam caused by aberration, and the like, by reducing the deflection angle of the electron beam.

Another object of the present invention is to provide a process for writing a pattern on a surface of an object by a focused electron beam with a minimized distortion of the electron beam, comprising the steps of: dividing the surface of the object into a number of parallel bands extending in a predetermined direction; moving the object in a direction perpendicular to the extending direction of the bands with a predetermined speed from a first band to a last band; achieving an exposure of the device pattern, one band by one band while moving the object in said direction with said predetermined speed; said predetermined speed being optimized with respect to an exposure interval representing a time interval in which the exposure of the band is possible, said exposure interval having a timing determined for each band and being shifted with time consecutively at a speed coincident to said predetermined speed of movement of the object, said predetermined speed being optimized such that the entire band can be exposed in said exposure interval and is determined by a critical band pattern that extends from the beginning of the exposure interval to the end of the exposure interval without interruption of the exposure, said critical band pattern comprising a band or a succession of the bands; adjusting the timing of exposure of the band in each exposure interval, said step of adjusting comprising the steps of:

(a) detecting said critical band pattern;

(b) shifting the timing of exposure for each band, starting from the band immediately before the critical band pattern and proceeding in a direction to the first band, such that the timing of exposure is shifted toward the center of the exposure interval to the extent that the exposure of the band does not overlap the exposure of the previous band;

(c) repeating said step (b) consecutively for the successive bands until the timing of exposure of the band reaches the center of the exposure interval;

(d) shifting the timing of exposure for each band, starting from the last band and proceeding in a direction to the critical band pattern, such that the timing of exposure is shifted toward the center of the exposure interval to the extent that the exposure of the band does not overlap the exposure of the previous band; and (e) repeating said step (d) consecutively for the successive bands until the timing of exposure of the band reaches the center of the exposure interval.

According to the present invention, one can adjust the timing of exposure of the band to be as close as possible toward the center of the exposure region. Particularly, by starting the adjustment from the band that immediately precedes the critical band pattern and proceeding to the first band or by starting the adjustment from the last band and proceeding to the critical band pattern, one can adjust the timing of exposure whenever such an adjustment is possible. Thereby, the deflection angle of the electron beam away from an optical axis of the electron optical system can be minimized and the distortion associated with such a deviation of the electron beam from the optical axis can be minimized.

Other objects and further features of the present invention will become apparent from the following detailed description when read in conjunction with the attached drawings.

BRIEF DESCRIPTION OF THE DRAWINGS

FIG. 23 is a diagram showing a third embodiment of the present invention wherein a plurality of optimized moving speeds are set in a single zone.

DETAILED DESCRIPTION OF THE PREFERRED EMBODIMENTS

Figure 1:
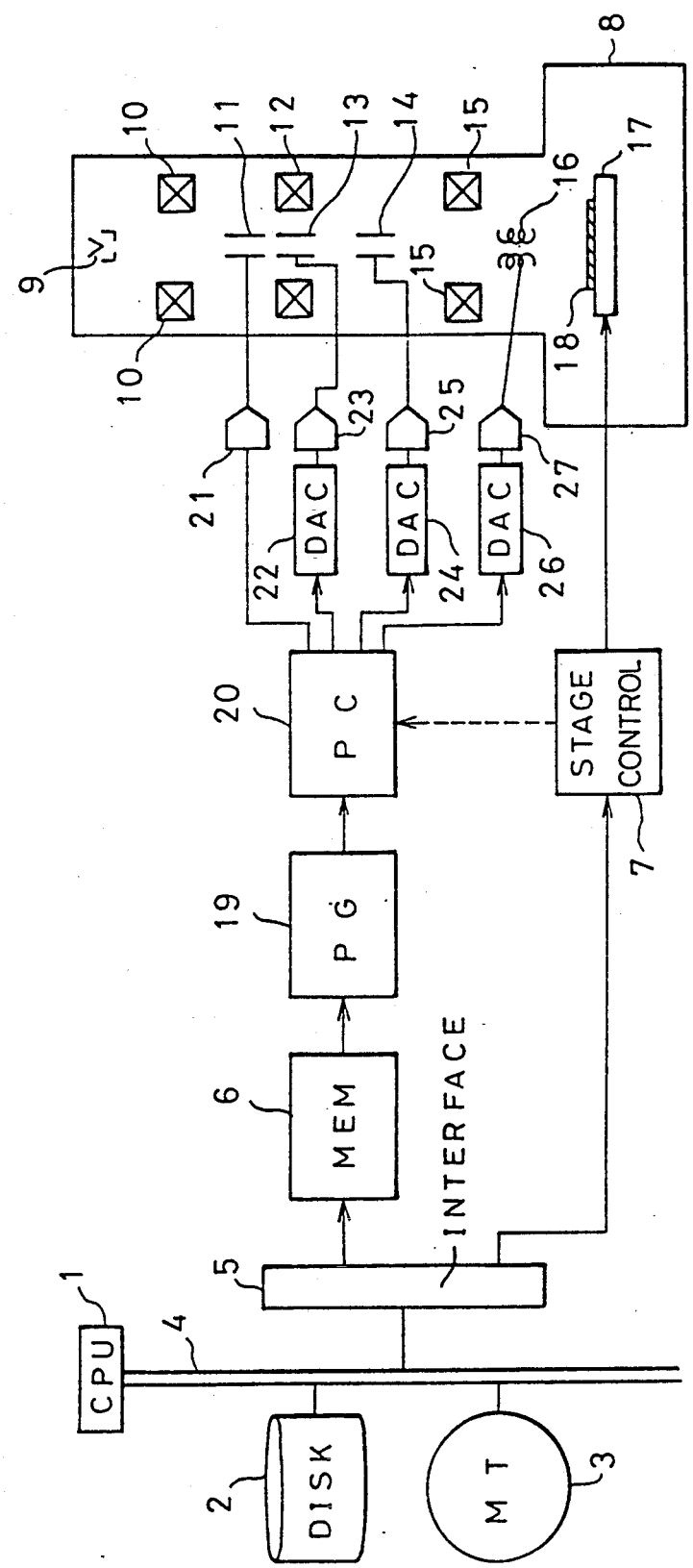
FIG. 1 is a diagram showing the overall construction of a conventional electron beam exposure system.
Figure 5:
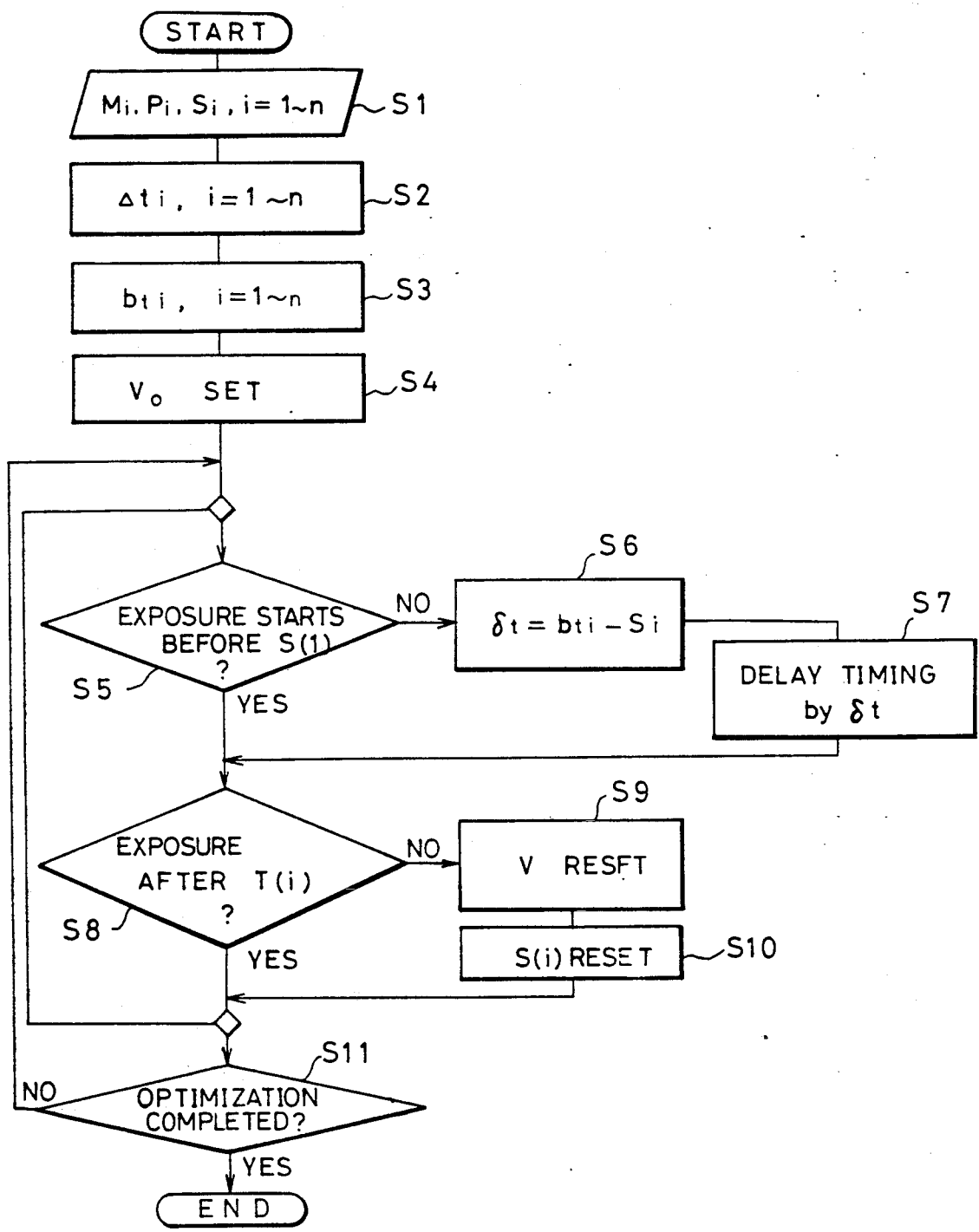
FIG. 5 is a diagram showing the flowchart for conducting the steps of FIGS. 6-11.

Hereinafter, a first embodiment of the present invention will be described with reference to FIG. 5 showing the flowchart of the operation that is conducted by the electron beam exposure system of FIG. 1 for optimizing the moving speed of the substrate 18. It should be noted that the optimization of the moving speed is achieved before the exposure process is actually started.

In a first step S1, the CPU 1 reads the pattern data such as the number of sub-fields $M_i$ included in the band, the number of patterns $P_i$ in the band, and the total number of shots $S_i$ in the band from a band memory that forms a part of the data memory unit 6, for each of the bands $B_1$-$B_n$, and wherein the suffix "i" represents the i-th band $B_i$ in the zone. The memory unit 6 includes, in addition to the band memory, a main deflector memory and a sub-deflector memory for storing data for controlling the deflectors 11 and 13 as well as other deflectors not illustrated. For details of the construction of the memory unit 6, reference should be made to the U.S. patent application Ser. No. 669,592 filed on Mar. 14, 1991, which application is incorporated herein by reference.

Figure 4:
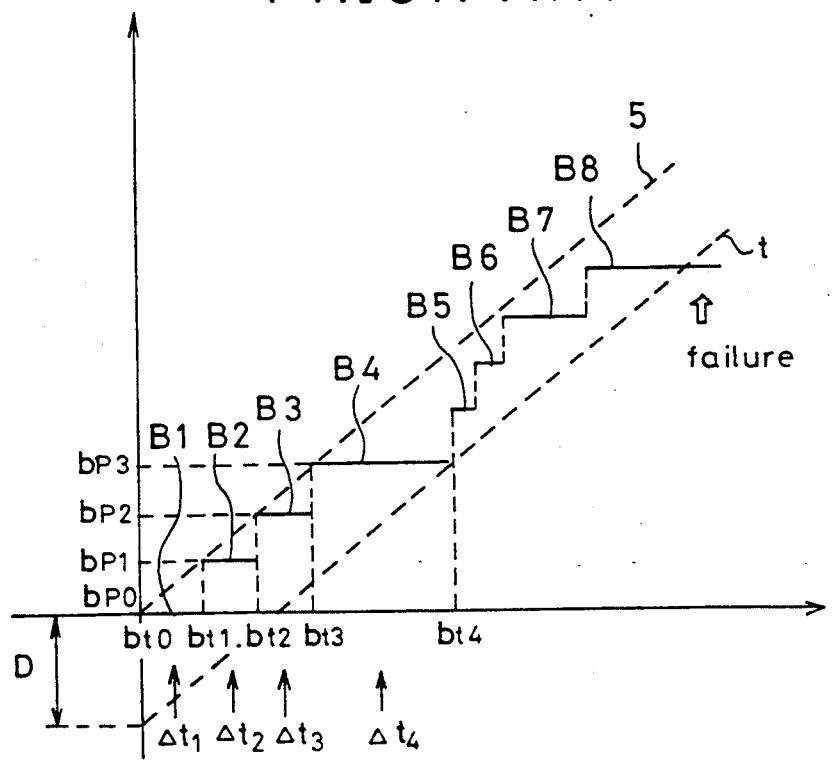
FIG. 4 is a diagram showing an example of the problem that occurs in the conventional exposure process of FIG. 3.

Next, in a step S2, the time needed for writing the pattern is calculated for each band according to an equation $$\Delta t_i = T_i \cdot M_i + T_P \cdot P_i + T_S \cdot S_i \qquad (1)$$

where $T_i$ represents the setting time of the electromagnetic deflector 16, $T_P$ represents the time needed for dividing the device pattern of the band $B_i$ into pattern elements, and $T_S$ represents the time needed for conducting the shots in correspondence to each pattern element. It should be noted that the time $\Delta t_i$ corresponds to the exposure time $\Delta t_1$, $\Delta t_2$, $\Delta t_3$, ... shown already in FIG. 4.

Based upon the exposure time $\Delta t_i$ of each band obtained in the step S2, the timing indicative of the time when the exposure of the device pattern is finished, is obtained for each band in a step S3, starting from the first band $B_1$ and proceeding consecutively to the last band $B_n$. Herein, it is assumed that the finishing of the exposure of one band is immediately followed by the starting of the exposure of the next band. Further, it should be noted that the position $bp_1$-$bp_n$ of the band edge on the substrate 18 is given already as a part of the pattern data.

Figure 6:
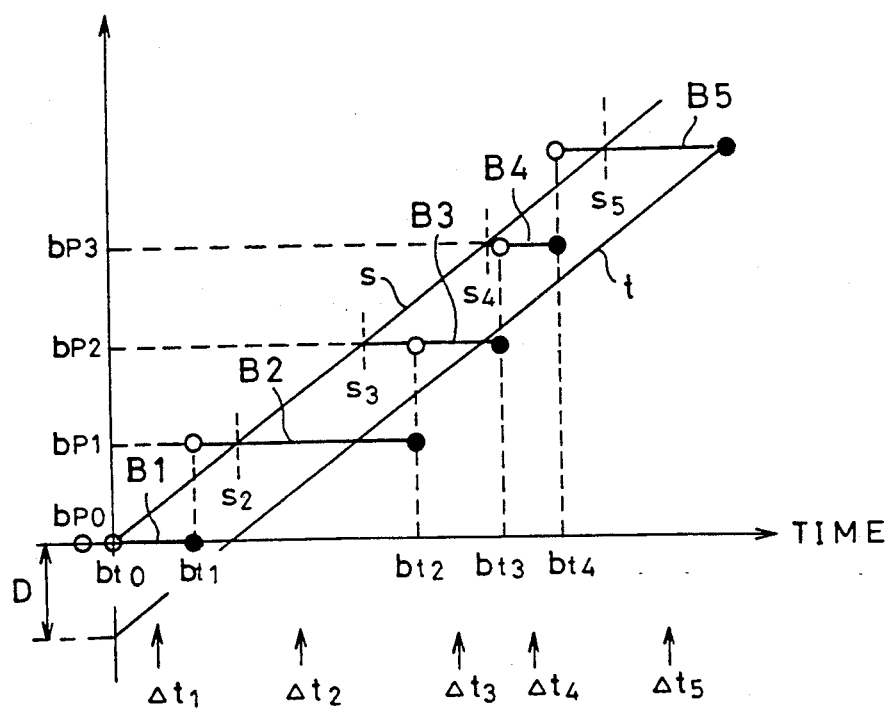
FIGS. 6-11 are diagrams showing the adjusting steps that is employed for setting the moving speed of the substrate.

FIG. 6 shows the relationship between the position and timing of the band obtained in the step S3 of FIG. 5.

Referring to FIG. 6, the timing $bt_1$ corresponding to the end of the exposure of the band $B_1$ is obtained at first in correspondence to the trailing edge $bp_1$ of the band $B_1$, as $bt_1 = bt_0 + \Delta t_1$. Here, the foregoing Eq. (1) is used for calculating the term $\Delta t_1$. Using the timing $bt_1$ as the starting timing of the exposure of the next band $B_2$, the timing for the end of the exposure of the band $B_2$ is obtained as $bt_2$, again based upon the above Eq. (1). Similarly, the timing for the end of the exposure of the band $B_3$ is obtained as $bt_3$ by assuming that the timing of the start of the exposure of the band $B_3$ coincides with the timing $bt_2$ for the end of exposure of the band $B_2$. Further, the end of the exposure of the band $B_4$ is obtained as $bt_4$.

In a next step S4 of FIG. 5, the initial speed $V_0$ of the stage 17 is determined. Usually, the initial speed $V_0$ is set much larger than the optimized speed to be obtained. For example, the initial speed $V_0$ is determined by dividing the distance between the leading edge $bp_0$ of the first band $B_1$ and the leading edge $b_{n-1}$ of the last band $B_n$ by a time sum of the exposure times $\Delta t_1$, $\Delta t_2$, $\Delta t_3$, .... In this case, the speed $V_0$ is given by $$V_0 = (bp_{n-1} + D)/(bt_n - bt_0)$$

wherein D represents the width of the exposure region. See FIG. 6.

In correspondence to the initial speed $V_0$ thus obtained, the movement of the leading edge of the exposure region 101 is determined as indicated in FIG. 6 by a line s. Further, in correspondence to the movement s of the leading edge, the movement of the trailing edge of the exposure region 101 is determined as a line t, wherein the line t is offset from the line s by the distance D corresponding to the width of the region 101 similarly to the case of FIG. 4.

In the state of FIG. 6, it will be noted that the beginning of the exposure of the band $B_2$ precedes the timing $s_2$ at which the exposure region 101 begins for the band $B_2$. In other words, the exposure of the band $B_2$ cannot be started with the timing $bt_1$ as long as the moving speed of the stage 17 is set to the foregoing initial value $V_0$.

In order to avoid the above noted problem, the process of the present embodiment achieves a check routine in a step S5 for discriminating whether the timing $bt_i$ for starting the exposure of a band $B_i$ precedes the timing $s_i$ at which the band $B_i$ enters into the exposure region 101, for each of the bands. In the situation shown in FIG. 6, the band $B_2$ is identified to be the band of which the exposure thereof precedes the timing s of the exposure region 101 as indicated by a solid circle X in FIG. 7.

Figure 7:
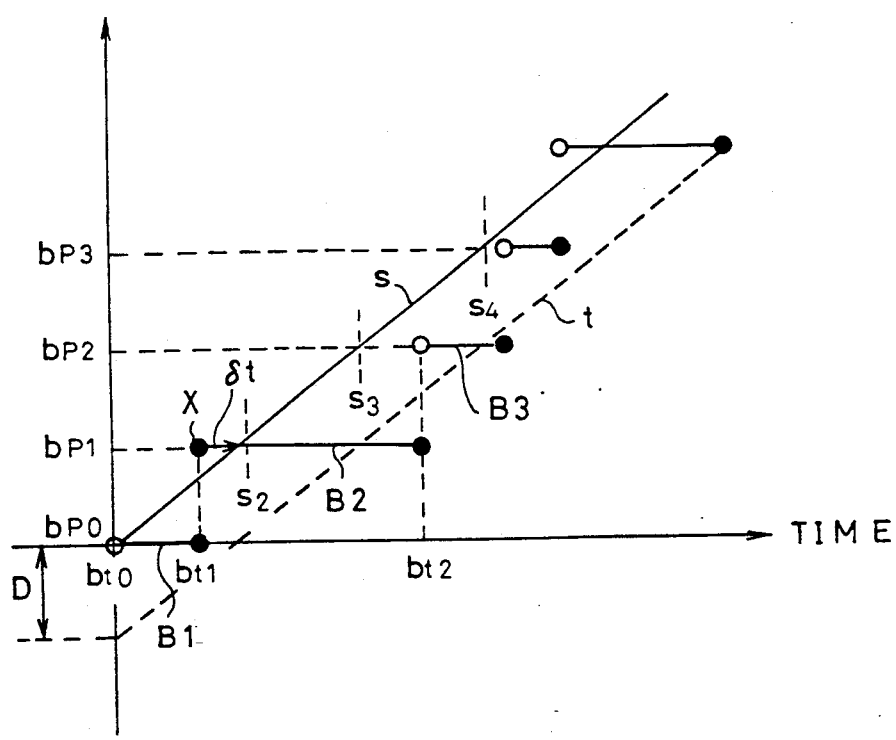
Figure 8:
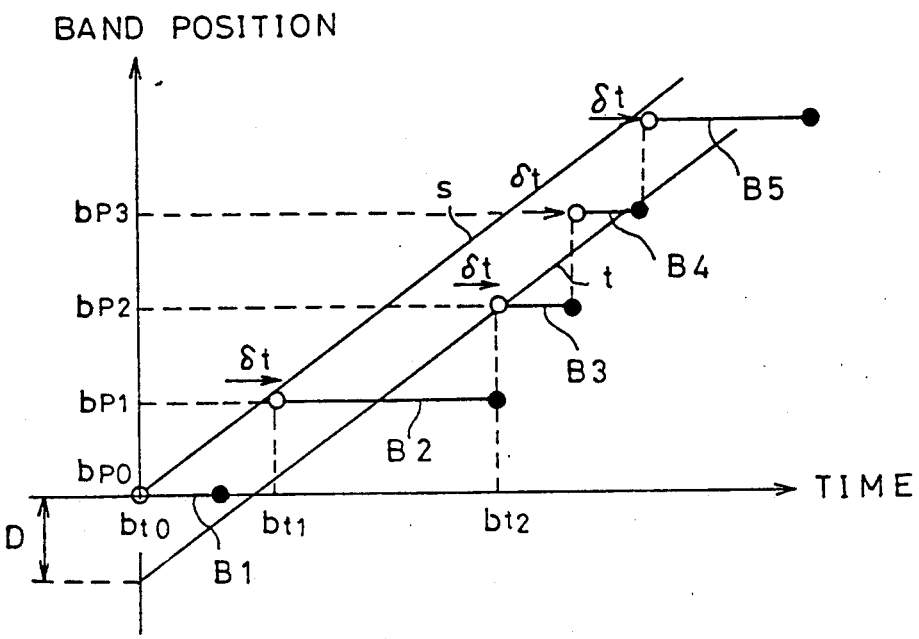

When the band $B_i$ that shows the above noted problem is found in the S5 as in the case of the band $B_2$, a step S6 is performed subsequently to obtain a time offset value $\delta t$ shown in FIG. 7 wherein $\delta t$ represents a time offset between the timing $bt_1$ corresponding to the start of the exposure of the band $B_2$ and a timing $s_2$ that represents the timing at which the band $B_2$ enters into the exposure region 101. Thereby, the start of the exposure of the band $B_2$ is delayed by $\delta t$. Next, in a step S7, the timing of the exposure for the bands that follow that band $B_2$ is delayed uniformly for all of the bands $B_3$-$B_n$ by $\delta t$ as shown in FIG. 8.

Next, a step S8 is conducted to discriminate whether there is a band of which the exposure thereof continues for an interval that extends beyond the timing given by the lint t of the exposure region 101, starting from the band $B_2$ and proceeding consecutively to the last band $B_n$. In the situation shown in FIG. 8, it will be noted that the band $B_2$ satisfies the above noted condition.

When the band extending beyond the timing t is found, a step S9 is performed to reset the moving speed of the substrate 18 according to the equation $$V = (bp_1 + D)/(bt_2 - bt_0). \quad (2)$$

Figure 9:
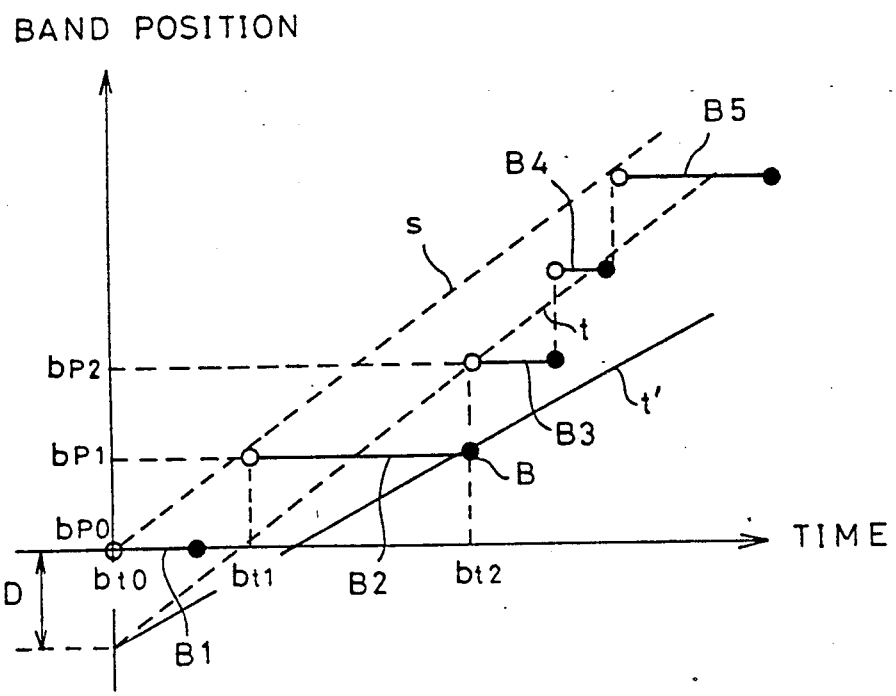

In response to the setting of the speed V shown in Eq. (2), the movement of the trailing edge of the exposure region 101 is now given by a line t' as shown in FIG. 9. It should be noted that the above Eq. (2) is represented in a more general form as $$V = (bp_{i-1} + D)/(bt_i - bt_0) \quad (3)$$

where it is assumed that the band $B_i$ is the band of which exposure continues beyond the timing t that is defined based upon the initial speed $V_0$.

Figure 10:
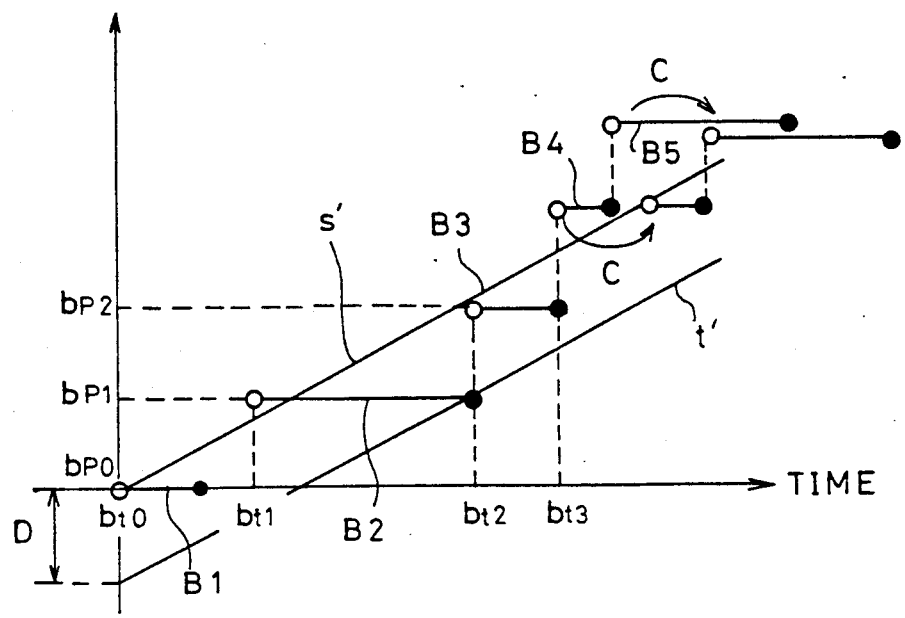

In correspondence to the new setting of the line t', the line s is re-defined as s' in a step S10 with a new slope corresponding to the speed V given by the above Eq. (2) or (3). Thereby, the lines s' and t' are defined with respect to the exposure intervals as shown in FIG. 10.

Next, the operation returns to the step S5 and the check routine is re-activated. There, it is checked whether the timing of exposure falls in the interval of the exposure region 101 as already explained, starting from the band $B_2$ and proceeding consecutively to the band $B_n$. In the example of FIG. 10, the timing $bt_1$ for the leading edge of exposure of the band $B_1$ precedes the timing of the line s' and the adjustment of the moving speed of the substrate 18 is achieved again by performing the steps S6-S10. Further, the foregoing loop of operation is repeated until the exposure timing falls in the interval between the line s' and t' for all of the bands $B_1$-$B_n$.

Figure 11:
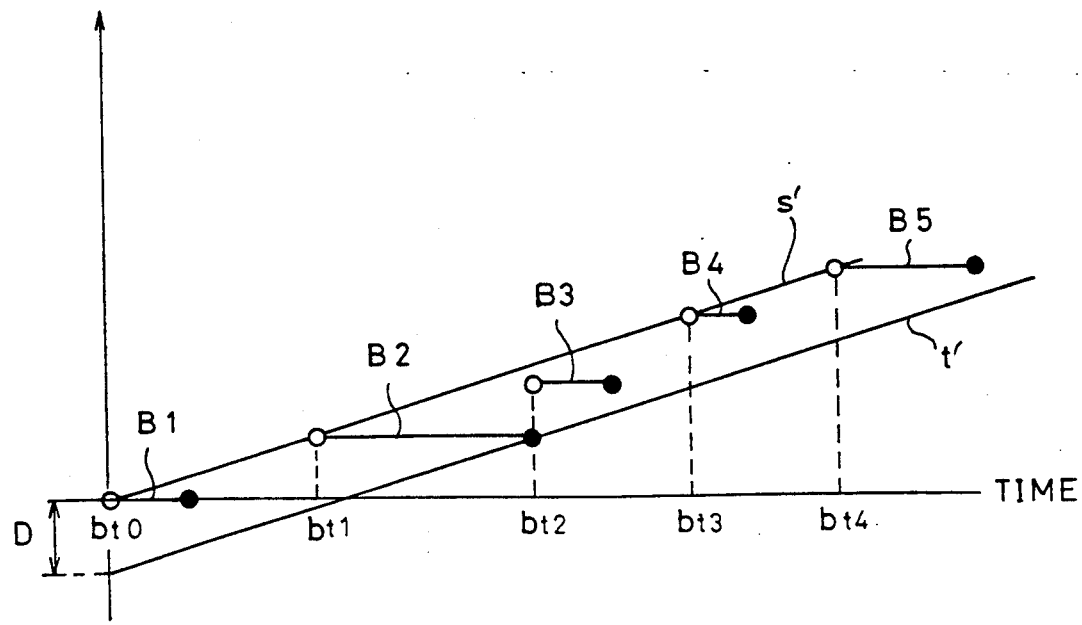

Finally, the timing of exposure is adjusted as shown in FIG. 11, wherein the moving speed of the stage 17 and hence the substrate 18 is optimized such that the timing of exposure is settled inside the interval between the line s' and the line t' for all the bands $B_1$-$B_n$. When the timing is sorted as such, the operation jumps directly from the step S5 to the step S8 and from the step S8 to a step S11, wherein a discrimination is made in the step S11 whether the optimization is completed or not by checking the result of the discrimination in the steps S5 and S8.

Once the moving speed of the substrate 18 is thus optimized as shown in FIG. 11, the actual exposure process is started by activating the electron gun 9 and writing the pattern on the substrate 18 while transporting the same at the optimized speed given by the slope of the lines s' and t' of FIG. 11.

During the exposure process, it should be noted that the electromagnetic deflector 16 and the electrostatic deflector 15 are driven such that the electron beam is deflected in accordance with the movement of the substrate 18 with respect to the optical axis that extends straight from the electron gun 9 to the substrate 18. There, the electrostatic deflector 15 can follow the movement of the substrate 18 in the range of about 20 $\mu$m, while the electromagnetic deflector 16 can follow the movement in the range of about 1 mm or more. This value of 1 mm is about ten times as large as the width $b_i$ of the band. Thus, by writing the pattern consecutively for each band while deflecting the electron beam with the movement of the substrate 18, one can increase the size D of the exposure region 101 significantly. When the size D is increased, one can increase the optimized speed of movement of the substrate and hence the efficiency of exposure operation.

In the foregoing exposure process of the first embodiment, it should be noted that there is a tendency that the timing of starting the exposure is set coincident to the line s, particularly when the bands that contain simple exposure patterns are continued. It should be noted that, in the steps S6 and S7 of FIG. 5, the timing of starting the exposure is delayed such that the exposure is started in synchronization with the passage of the line s.

It should be noted that such an adjustment of the timing in turn causes the situation in that the exposure of the band tends to be achieved in correspondence to the leading edge part of the exposure region 101. In the leading edge part, the electromagnetic deflector 16 deflects the electron beam with a large deflection angle, and such a large deflection of the electron beam tends to invite unwanted deformation of the electron beam by various aberrations.

Next, a second embodiment of the present invention for eliminating the foregoing problem will be described.

Figure 12:
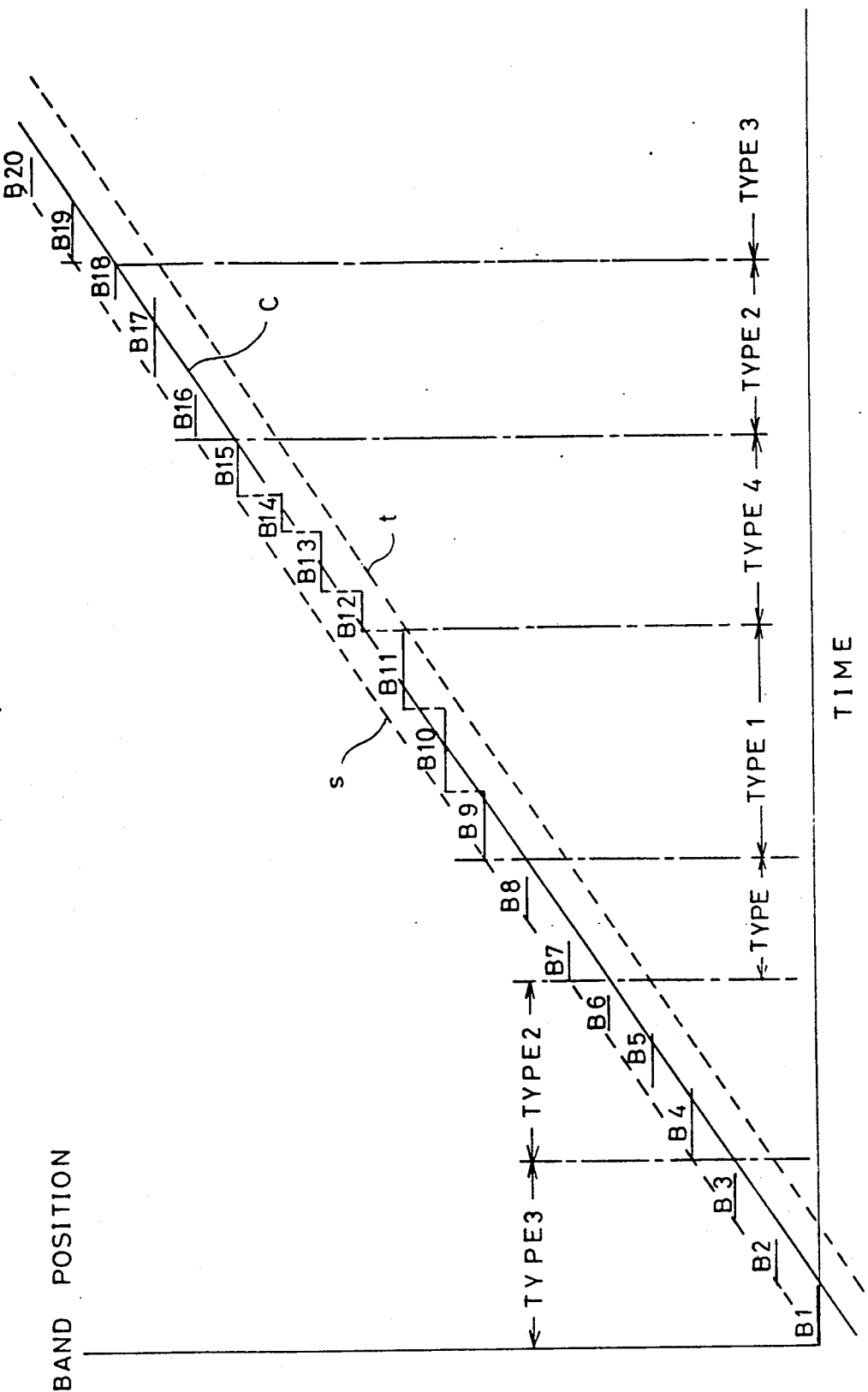
FIG. 12 is a diagram showing an example of the arrangement of the band intervals in a zone defined on the surface of a substrate, for an optimized moving speed of the substrate.

FIG. 12 is a diagram similar to FIG. 11 and shows an example of the timing of exposure of the bands for an optimized speed obtained in the previous embodiment. FIG. 12 shows the timing of exposure or band interval for the bands $B_1$–$B_{20}$. In FIG. 12, the lines s and t correspond to the lines s' and t' of FIG. 11 and have the slope coincident to the optimized speed of the substrate 18. Thereby, the timing of the exposure region 101 is determined for each band $B_i$ such that the exposure region 101 starts with a timing s(i) and ends with a timing t(i). Further, FIG. 12 shows a line C corresponding to the center of the interval of the exposure region 101. It should be noted that the line C corresponds to the optical axis of the electron optic system.

Referring to FIG. 12, it will be noted that there are bands such as the band $B_8$ for which the exposure timing can be shifted closer to the center line C without causing substantial change in the exposure operation. It should be noted that, because of the reduction of the moving speed in the optimization process, there is a tendency that an unexposed interval is formed between one band interval and the adjacent band interval, wherein the exposure operation is interrupted in correspondence to the unexposed interval. Thus, the timing of the band interval $B_8$ may be shifted such that the end of the band interval $B_8$ coincides with the beginning of the band interval $B_9$. It should be noted, on the other hand, that further delay of the band interval $B_8$ with respect to the band interval $B_9$ is not possible, as the simultaneous exposure of two bands is not possible in the electron beam exposure system of FIG. 1. When the band interval $B_8$ is shifted as such, the band interval $B_7$ can also be shifted toward the center line C.

It should be noted that the foregoing unexposed interval may or may not appear depending on how the band intervals are arranged on the time axis at the time of optimization of the moving speed. For example, there must be a band interval or a succession of band intervals wherein there is no such interruption of exposure between the band intervals. In fact, the existence of such a succession of band intervals having no interruption of the exposure determines the optimized speed of the substrate. In the example of FIG. 11, the single band interval $B_2$ extends from the line s to the line t sets the optimized speed. Thereby, the timing of this band cannot be adjusted anymore.

In order to find out the respective bands for which the exposure timing thereof can be adjusted and for which the exposure timing thereof cannot be adjusted under the optimized moving speed of the substrate 18, it is necessary to classify the succession of the band intervals into categories or types. Particularly, it is important to find out the band or the succession of bands that determines the optimized speed.

FIG. 12 shows an example of such a classification, wherein it can be recognized that there exist four distinct band patterns, i.e., TYPE1, TYPE2, TYPE3 and TYPE4 patterns in the succession of the band intervals that starts with the band interval $B_1$ and ends with the band interval $B_{20}$. In addition to the foregoing four types of patterns, there exists another pattern, TYPE5, as will be described below.

Figure 13:
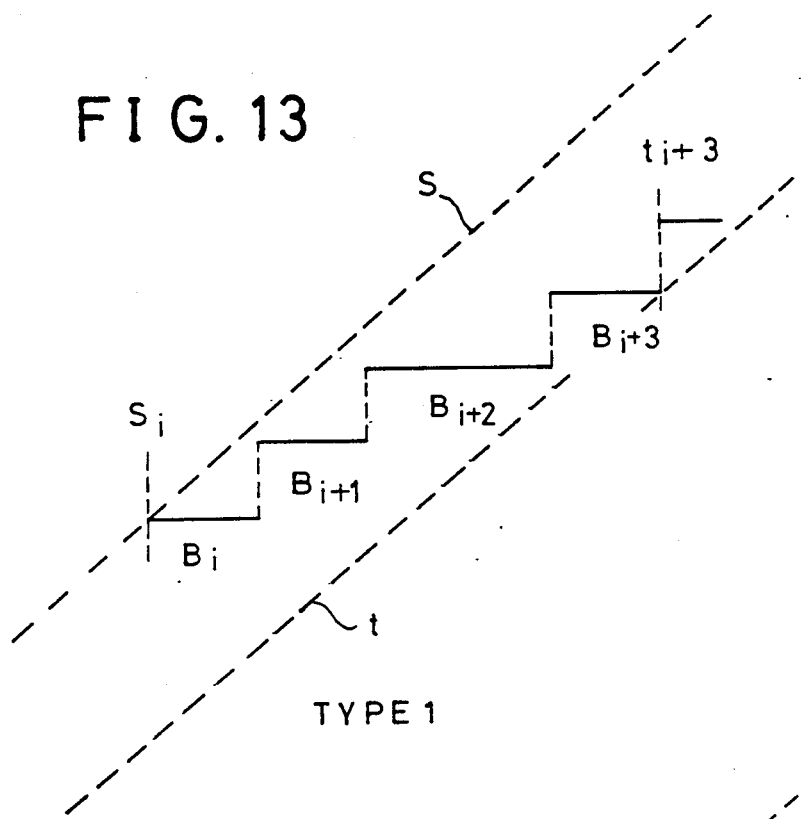
FIGS. 13-17 are diagrams showing the fundamental band patterns that appear in the pattern shown in FIG. 12.

FIG. 13 shows an example of the TYPE1 pattern in detail. Referring to FIG. 13, the illustrated example includes band intervals $B_i$–$B_{i+3}$, wherein the band pattern extends from the line s to the line t without interruption of the exposure. Thus, the exposure of the band $B_i$ starts with the timing $s_i$ and proceeds consecutively to the last band $B_{i+3}$ without interruption of exposure, and wherein the exposure of the band $B_{i+3}$ ends with the timing $t_{i+3}$. It should be noted that such a TYPE1 pattern determines the optimized moving speed of the substrate in the optimization process described in the first embodiment. When the moving speed of the substrate is increased further, it will be understood that the complete exposure of the bands in the TYPE1 pattern becomes impossible.

Figure 14:
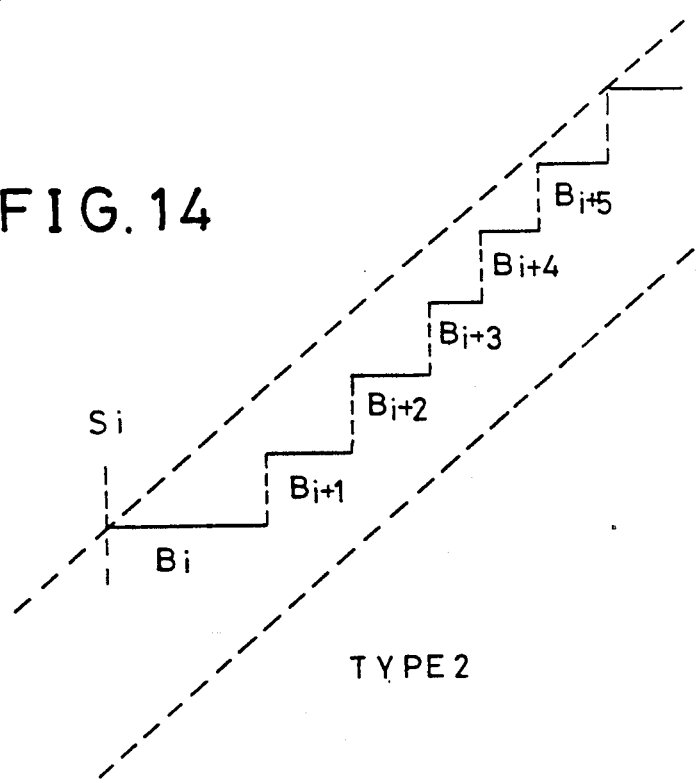

FIG. 14 shows an example of the TYPE2 pattern. This pattern includes the band intervals $B_i$–$B_{i+5}$ wherein the exposure of the band $B_i$ starts in correspondence to the timing $s_i$ and proceeds to the last band $B_{i+5}$ without interruption. It can be seen that the band interval $B_i$ has a relatively long exposure time while the bands that follow thereto have a limited exposure time. Thereby, the timing of the exposure approaches the line s gradually, and the exposure of the band that follows the last band $B_{i+5}$ starts in correspondence to the line s. On the other hand, none of the band intervals reach the timing of the line t.

Figure 15:
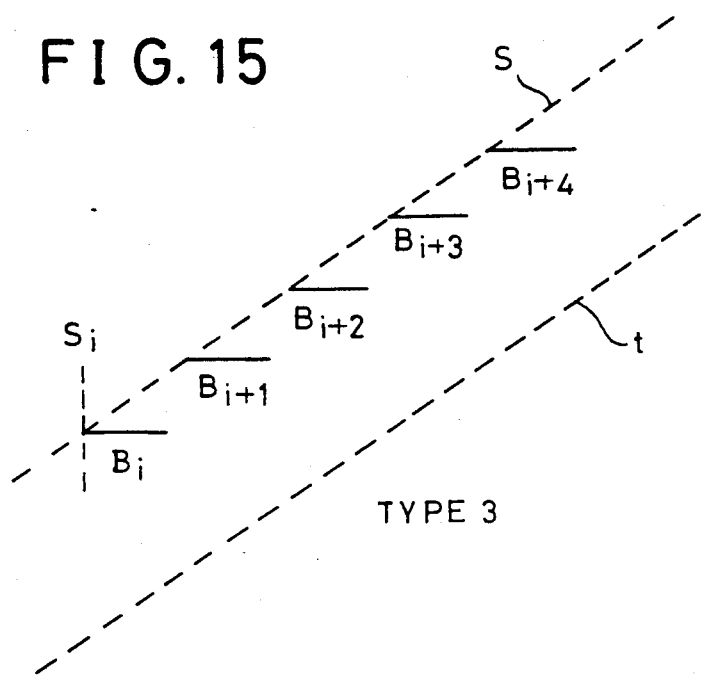

FIG. 15 shows an example of the TYPE3 pattern, wherein the illustrated example includes the band intervals $B_i$–$B_{i+4}$. In the TYPE3 pattern, the exposure of the band starts in correspondence to the timing given by the line s for all the band intervals. On the other hand, none of the band intervals reach the timing of the line t. The TYPE3 pattern appears when bands containing simple exposure patterns continue consecutively.

Figure 16:
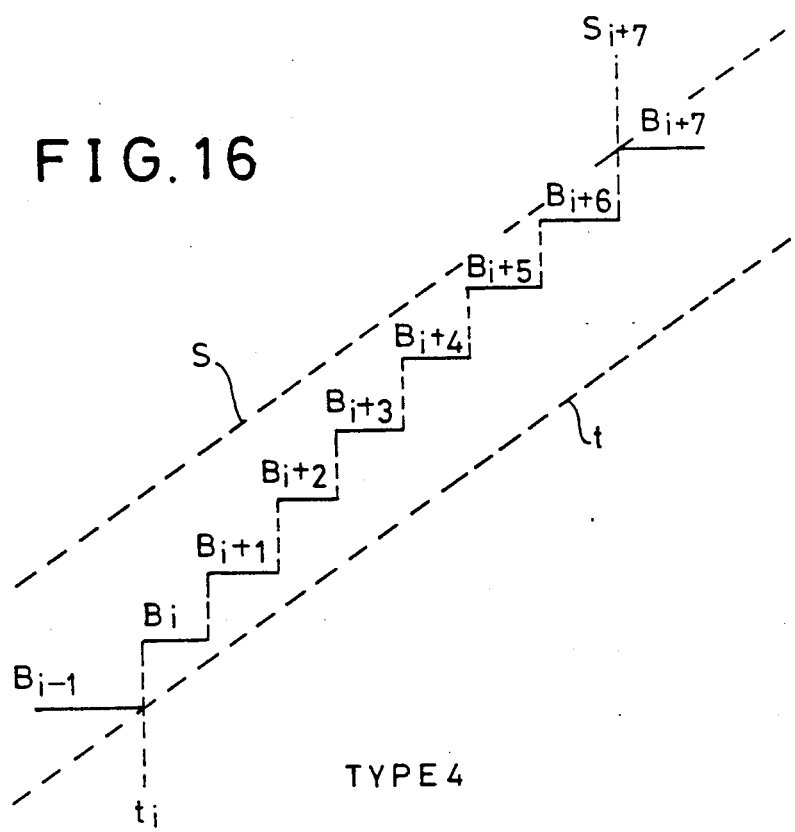

FIG. 16 shows an example of the TYPE4 pattern, wherein the illustrated example includes the band intervals $B_i$–$B_{i+6}$, wherein the band interval $B_i$ begins with a timing coincident to the timing $t_i$. It should be noted that the exposure of the band $B_{i-1}$ that precedes the band $B_i$ is completed with the timing $t_i$ that is located on the line t. After the band $B_i$, simple patterns continue in the bands $B_{i+1}$, ... and the beginning of the band interval $B_{i+7}$ ultimately reaches a timing $s_{i+7}$ that is coincident with the line s. It should be noted that the TYPE4 pattern appears after the TYPE1 pattern or the TYPE5 pattern to be described below has appeared.

Figure 17:
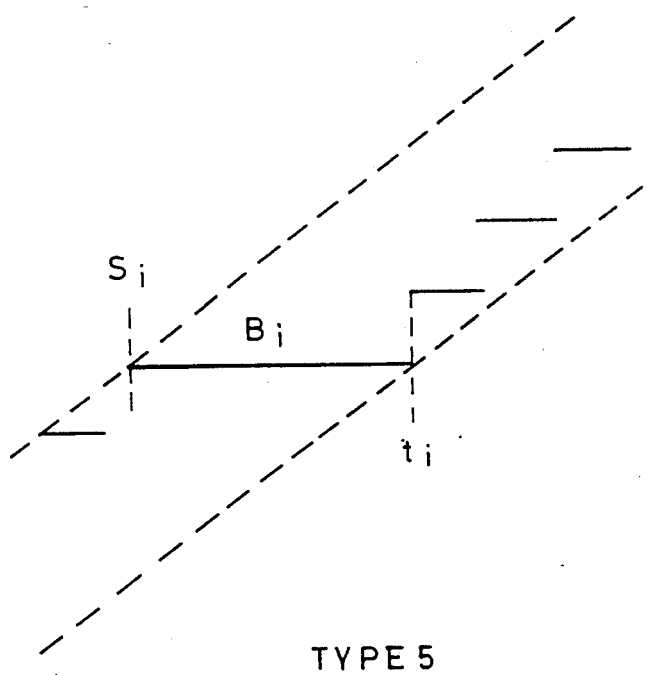

FIG. 17 shows an example of the TYPE5 pattern. It should be noted that the TYPE5 pattern includes a single band interval $B_i$ of for which the exposure thereof begins with a timing $s_i$ and ends with a timing $t_i$. In other words, the exposure of the band $B_i$ continues for the entire interval of the exposure region. Thus, the band interval $B_i$ of FIG. 17 corresponds to the band interval $B_2$ of FIG. 11.

The adjustment of the exposure timing of the bands is achieved first by finding out the critical pattern that determines the optimized moving speed of the substrate. As already noted, such a critical pattern is either the TYPE1 pattern or the TYPE5 pattern. As long as the moving speed is constant, there is only one such critical pattern in a zone.

Figure 18:
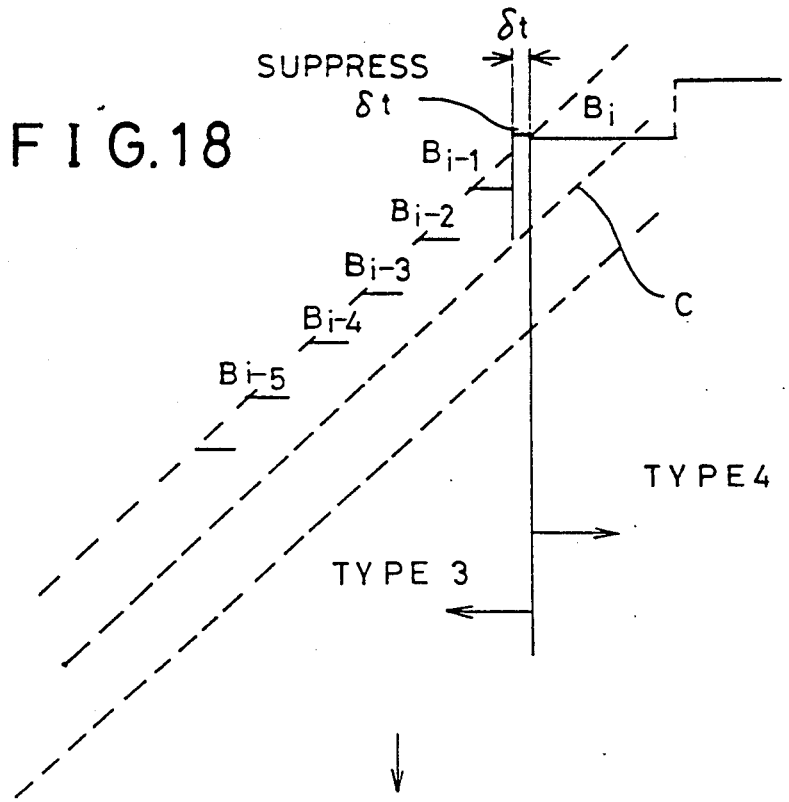
FIGS. 18-21 are diagrams showing the adjustment of timing of the band interval that is achieved according to a second embodiment of the present invention.
Figure 19:
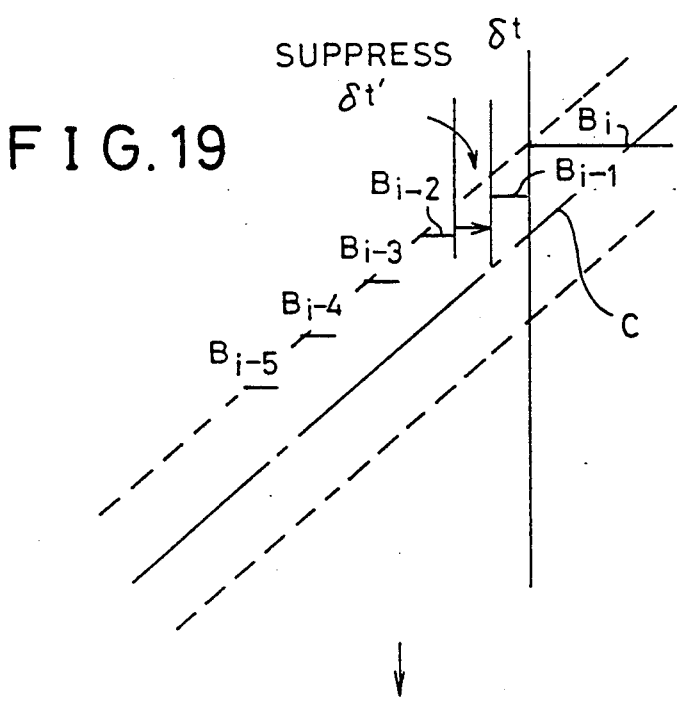

Assuming that the TYPE1 pattern was found as shown in FIG. 18 in the given zone with the TYPE3 pattern preceding the TYPE1 pattern, and designating the first band interval of the TYPE1 pattern as $B_i$, the timing of the band interval $B_{i-1}$ that immediately precedes the band interval $B_i$ is shifted by δt until the end of the band interval $B_{i-1}$ coincides with the beginning of the band interval $B_i$. Thereby the interval δt, corresponding to the interruption of the exposure, is suppressed. Next, as shown in FIG. 19, the timing of the band interval $B_{i-2}$ that immediately precedes the band interval $B_{i-1}$ is shifted by $\delta t'$ until the end of the band interval $B_{i-2}$ coincides with the beginning of the band interval $B_{i-1}$.

Figure 20:
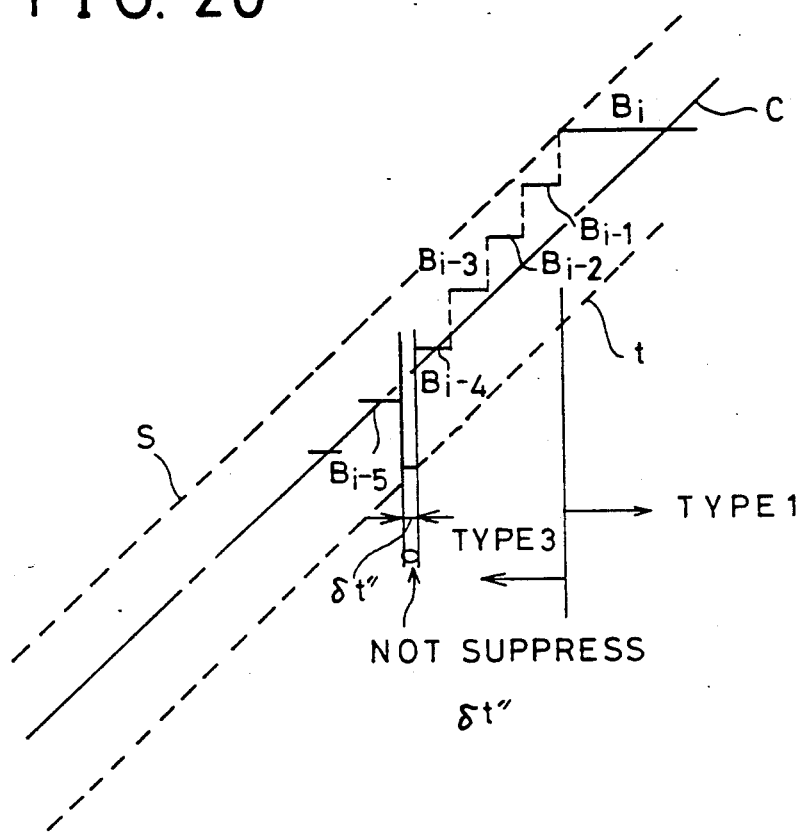
Figure 21:
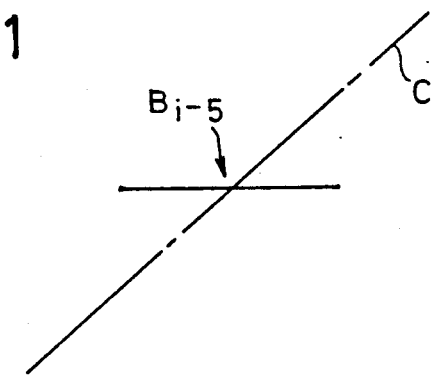

By repeating the above shifting of the timing for the bands $B_{i-3}$, $B_{i-4}$, ... consecutively as shown in FIG. 20, the timing of the band interval approaches gradually to the center line C, wherein a band interval such as the band interval $B_{i-5}$ ultimately reaches the center line C as shown in FIG. 21. When this state is achieved, the shift of the band interval is deactivated, even when there is room for such a shift as shown by $\delta t''$ in FIG. 20. Thereby, one can avoid the unwanted concentration of the band interval at the opposite side of the exposure region defined by the line t.

Further, a similar adjustment of the timing of the band interval is achieved, starting from the last band interval $B_n$ and proceeding consecutively in the forward direction until one reaches the critical pattern found at the beginning of the adjustment procedure. By starting the adjustment from the last band $B_n$ and proceeding in the forward direction rather than starting from the band interval next to the last band interval $B_i$ and proceeding to the last band interval, one can achieve the adjustment of band interval also in the TYPE4 pattern that follow the TYPE1 or TYPE5 pattern. It should be noted that the TYPE4 pattern always follows the TYPE1 or TYPE5 pattern. Compare FIG. 16 with FIG. 13 or FIG. 17. When the adjustment is made in the reverse direction toward the last band $B_n$, one cannot adjust the timing of the band intervals included in the TYPE4 pattern at all as the band intervals included in the TYPE4 pattern are arranged without interruption.

By adjusting the timing as such, one can achieve the exposure in correspondence to the center line C. Thereby, the unwanted effect of distortion of the electron beam associated with the large offset from the optical axis of the electron optic system is minimized.

The foregoing adjustment is also effective when the TYPE2 pattern precedes the TYPE1 or TYPE5 pattern. Further, the adjustment according to the principle described with reference to FIGS. 18-21 is effective whenever there exist the band intervals in the zone in accordance with the band patterns TYPE2 or TYPE3. As already noted, the adjustment of the band timing is possible also in the TYPE4 pattern when the adjustment is started from the last band of the zone and proceeded in the forward direction.

Next, the process for classifying the set of given band intervals into the TYPE1, TYPE2, TYPE3, TYPE4 and TYPE5 patterns and for finding out the critical pattern such as the TYPE1 pattern or the TYPE5 pattern, will be described with reference to the flowcharts of FIG. 22.

Figure 22:
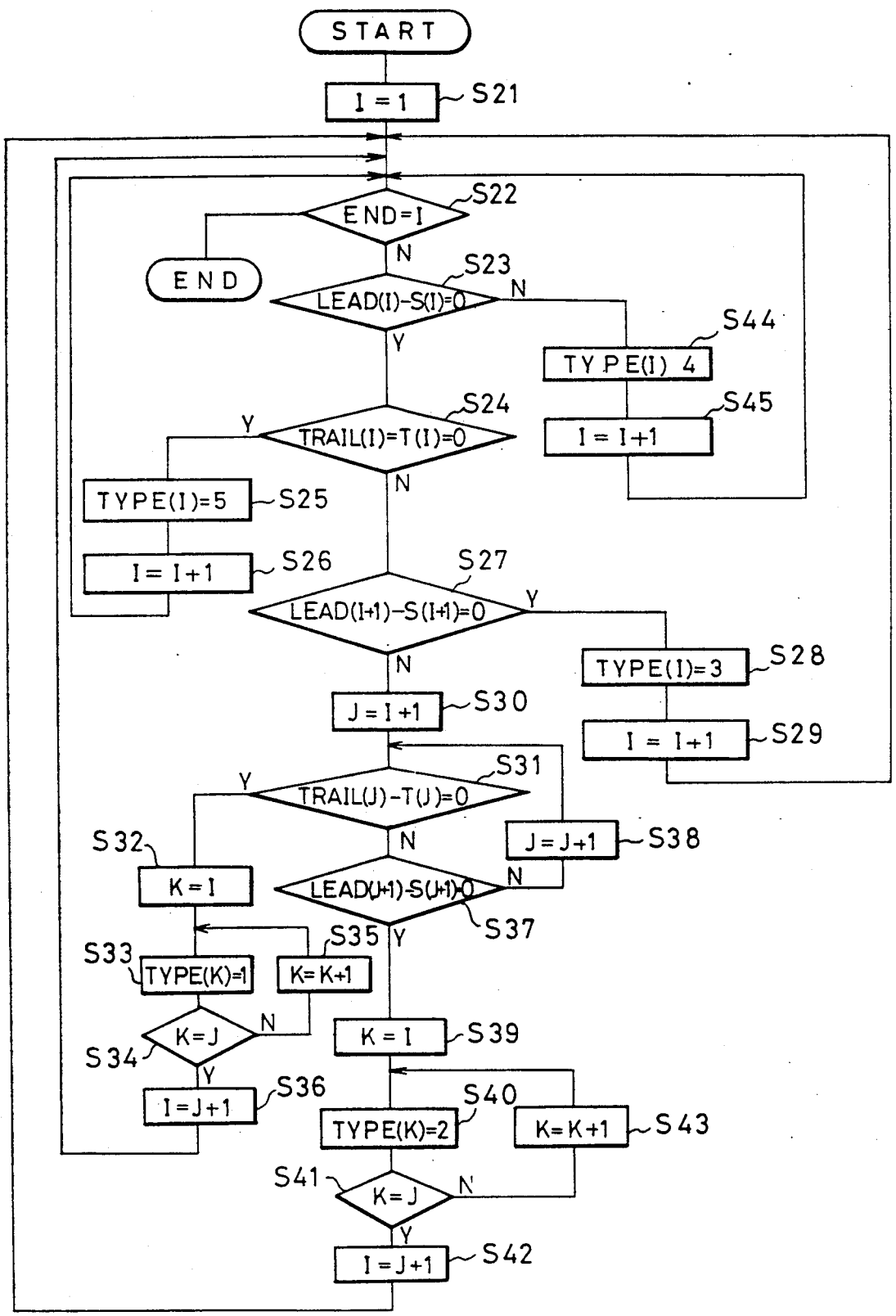
FIG. 22 is a flowchart showing the process for classifying the band pattern as shown in FIG. 12 into the fundamental band patterns shown in FIGS. 13-17.

Referring to FIG. 22, the process starts with a step S21 wherein the first band $B_i$ is selected by setting a variable I such that $I=1$. Here, the variable I corresponds to the number of the band counted from the first band. Thus, the step S1 specifies the band interval $B_1$. Next, in a next step S22, it is discriminated whether the current band under examination is the last band or not. At the beginning of the process, the result of the step S22 is of course NO and the process proceeds to a step S23.

In the step S23, a discrimination is made whether the beginning of the band interval $B_i$ represented as LEAD(I) ($I=1$ in the present case) precedes the timing s of the exposure region for the first band $B_1$ represented as S(I) ($I=1$ in the present case). As the timing of the first band interval $B_1$ is region, the result of the discrimination in the step S23 is YES and a next step S24 is carried out.

In the step S24, it is discriminated whether the timing of the end of the band interval $B_1$ represented as TRAIL(I) ($I=1$ for the present case) is coincident to the timing t of the exposure region for the first band $B_1$ represented as T(I) ($I=1$ for the present case). There, it will be understood that if the result is YES, it means that the band interval extends from the entire interval of the exposure region and hence the band interval $B_1$ forms the TYPE5 pattern. Thus, in a next step S25, a flag indicating the TYPE5 is set in a variable TYPE(I) ($I=1$ for the present case). After the step S25, the variable I is increased by 1 in a step S26 in correspondence to the next band interval and the operation returns to the step S22.

When it is discriminated in the step S24 that the end of the band interval $b_i$ does not coincide with the timing t (TRAIL(I)−T(I)≠0), on the other hand, there is a possibility that the band interval may belong to any of the TYPE1, TYPE2 and TYPE3 patterns. In this case, a discrimination is achieved for the next band interval $B_{i+1}$ ($=B_2$, when considering the first band interval $B_1$ for the band $B_i$) in a step S27 about whether the beginning of the band interval $B_{i+1}$ agrees to the timing s of the same band interval $B_{i+1}$ (LEAD(I+1)−S(I+1)=0). If the result is YES, this means that the band interval $B_i$ belongs to the TYPE3 pattern. See FIG. 15. Thus, in a step S28, a flag indicative of the TYPE3 pattern is set for the band interval $B_i$ ($=B_1$, if $i=1$). Next, the variable I is increased by 1 in a step S29, and the process returns to the step S22.

When the result of discrimination in the step S27 is NO, this means that there is a possibility that the current band interval $B_i$ ($=B_1$, when $i=1$) that is under examination belongs to the TYPE1 or TYPE2 pattern. In order to decide which type the current band interval belongs to, a search is made in steps S30 through S38 for the band interval $B_j$ that appears after the band interval $B_i$ ($j>i$) and has the end coincident to the timing $t_j$ (TRAIL(J)−T(J)=0, step S31) as well as for the band interval $B_j$ that appears after the band interval $B_i$ ($i>j$) and has the beginning coincident to the timing $s_j$ (LEAD(J)−S(J)=0, step S37). A band interval $B_j$ that satisfies the condition of the step S31 is found, then it means that the band intervals that are located between $B_i$ and $B_j$ all belong to the TYPE1 and a flag indicative of the TYPE1 is set for each of the band intervals by carrying out steps S32-S35. Further, the variable I is reset to the last value of J in a step S36 and the process returns to the step S22.

On the other hand, when a band that satisfies the condition of the step S37 is found, this means that the band interval that is located between the band $B_i$ and the band $B_j$ belong to the TYPE2. Thus, a flag indicative of TYPE2 is set by carrying out steps S39-S43 for the band intervals that are included in the above mentioned range.

Further, the variable J is updated in a step S42, and the process returns to the step S22 for continuing the classification of type further for the band intervals that follow.

When it is discriminated in the step S23 that the result of discrimination is NO, this means that the band interval $B_i$ under examination belongs to the TYPE4 pattern.

It should be noted that the classification process of FIG. 22 is started from the first band of the step S23 is always YES. When the process is carried out according to the foregoing procedure, those band intervals belonging to the TYPE1 or TYPE 2 and simultaneously giving the result of discrimination of NO in the step S23, are already detected. Thus, steps S44 and S45 are carried out wherein the flag indicative of TYPE4 is set in correspondence to the detected band interval $B_i$.

By conducting the foregoing steps starting from the band $B_1$ and reaching the last band $B_n$, one can detect the TYPE1 or TYPE5 pattern in the zone, and starting from the pattern thus found out, the foregoing adjustment of the band interval is achieved consecutively to optimize the exposure operation.

Next, a third embodiment of the present invention will be described with reference to FIG. 23 that shows a case wherein the optimized speed of movement of the substrate is changed depending on the pattern to be written on the substrate.

Figure 2:
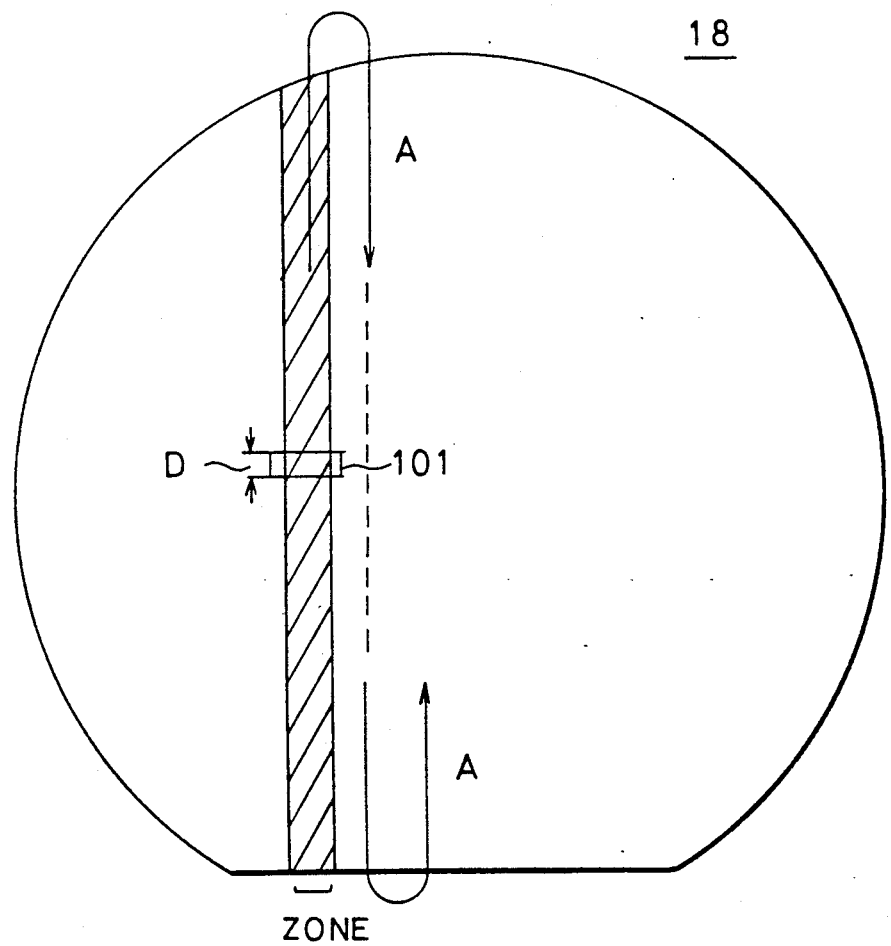
FIG. 2 is a diagram showing the conventional process for writing a semiconductor pattern on a surface of a substrate.
Figure 3:
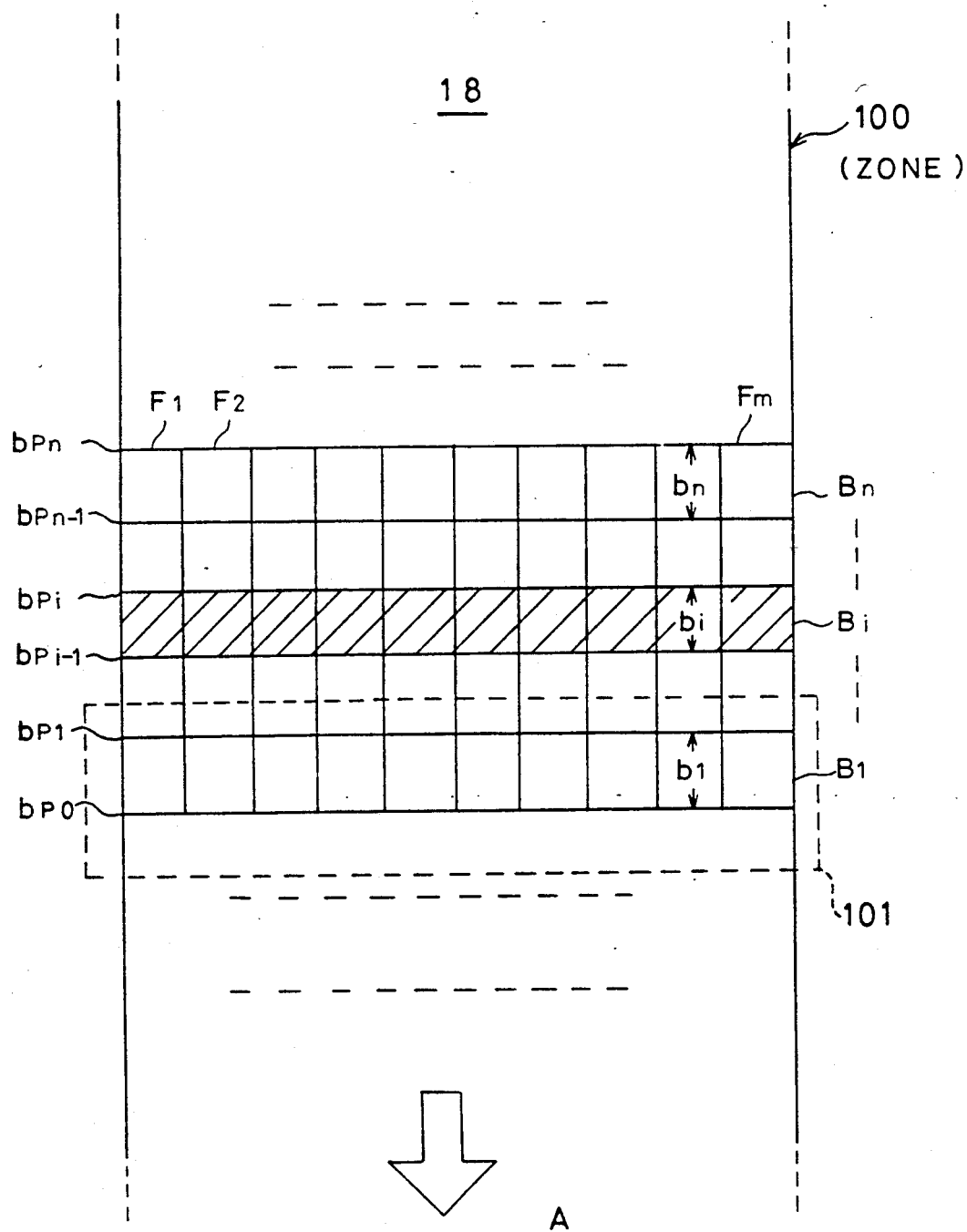
FIG. 3 is a diagram showing the details of exposure according to the process of FIG. 2 in an enlarged scale.

More specifically, the present embodiment applies the foregoing optimization of the moving speed by dividing the zone 100 (see FIG. 2) into a plurality of regions each including a plurality of bands, and the optimization is achieved according to the procedure described in the first embodiment for each region. Thus, the initial speed $V_0$ is set for each region and the optimization is achieved for each region, starting from the initial speed $V_0$. When such a procedure is applied, there appear a plurality of critical patterns such as the TYPE1 pattern or TYPE5 pattern in each zone as shown in FIG. 23.

In applying the optimization of the band interval for such a case, the process described with reference to the second embodiment is conducted, by first classifying the zone into the types and next by adjusting the timing of the band interval, starting from the last band $B_n$ and proceeding toward the first band $B_1$, until one encounters a critical pattern that may be a TYPE1 pattern or a TYPE5 pattern. When a critical pattern is reached, the adjustment is restarted in the direction of the first band $B_1$ until one encounters a next critical pattern. By repeating such a procedure a plurality of times, one can achieve the optimization of the timing of the band interval for the entire zone. In FIG. 23, it should be noted that the change of the moving speed of the substrate is smoothed in consideration of the finite inertia of the stage driving mechanism.

Further, the present invention is not limited to the embodiments described heretofore, but various variations and modifications may be made without departing from the scope of the invention.

What is claimed is:

1. A method for writing a pattern on a surface of an object by a focused electron beam with a minimized distortion of the electron beam, comprising the steps of:
    dividing the surface of the object into a plurality of parallel bands extending in a predetermined direction;
    moving the object in a direction perpendicular to the extending direction of the bands, with a predetermined speed and from a first band to a last band of the plurality of parallel bands;
    achieving an exposure of the device pattern, one band by one band, while moving the object in said direction with said predetermined speed;
    said predetermined speed being optimized with respect to an exposure interval representing a time interval in which the exposure of each parallel band is possible, said exposure interval having a timing which is determined for each band and is shifted with time consecutively and in correspondence to said predetermined speed of the movement of the object, said predetermined speed being optimized such that each of the plurality of parallel bands, beginning from the first band and ending with the last band, can be exposed in said exposure interval and is determined by a critical timing pattern, said critical timing pattern representing the timing of the exposure of a critical band or the timing of the exposure of a succession of critical bands and extending from the beginning of the exposure interval to the end of the exposure interval without substantial interruption of the exposure, said critical band setting the highest possible limit of the moving speed of the object which still permits the completion of the exposure of all of the plurality of parallel bands; and
    adjusting the timing of exposure of each parallel band in each exposure interval, said step of adjusting comprising the steps of:
    (a) detecting said critical timing pattern;
    (b) shifting the respective timing of exposure for each parallel band, starting from the band immediately before the critical timing pattern and proceeding in a direction to the first band, such that the respective timing of exposure of each parallel band is shifted toward the center of the corresponding exposure interval therefore, to the extent that the exposure of each parallel band does not overlap the exposure of the respective, next previous parallel band; and
    (c) repeating said step (b) in consecutive sequence for each of the plurality of parallel bands until the respective timing of exposure of each parallel band reaches the center of the corresponding exposure interval.

2. A method as claimed in claim 1 in which said exposure interval is set such that the distortion of the electron beam is minimum when the exposure is achieved within the exposure interval.

3. A method as claimed in claim 1 in which said method further comprises the steps of:
    (d) shifting the respective timing of exposure for each parallel band, starting from the last parallel band and proceeding in a direction to the critical timing pattern, such that the respective timing of exposure is shifted toward the center of the exposure interval, to the extent that the exposure of each parallel band does not overlap the exposure of the respective, next previous band; and
    (e) repeating said step (d) consecutively for the plurality of parallel bands until the respective timing of exposure of each of the plurality of parallel bands reaches the center of the corresponding exposure interval.

4. A method as claimed in claim 1 in which said step of detecting the critical timing pattern comprises the steps of:
    creating a timing chart representing the timing of exposure of the bands and the respective positions of the bands that are to be exposed;
    dividing the timing chart into a plurality of fundamental patterns, each representing one of five fundamental patterns; and
    determining said critical timing pattern.

5. A method as claimed in claim 4 in which said five fundamental patterns include:

a first pattern of a first plurality of bands, starting from an initial band and ending with a final band, said initial through said final bands of the first pattern being exposed consecutively without interruption, the exposure of the first band of the first pattern being exposed consecutively without interruption, the exposure of the first band of the first pattern being started at a timing coincident with the beginning of the exposure interval and the exposure of the final band of the first pattern being ended at a timing coincident with the end of the exposure interval;

a second pattern of a second plurality of bands, starting from an initial band and ending with a final band, said initial through said final bands of the second pattern being exposed consecutively without interruption, the exposure of the initial band of the second pattern being started at a timing coincident with the beginning of the exposure interval and the exposure of other bands of the second pattern being achieved after a delay from the beginning of the exposure interval yet before the end of the exposure interval;

a third pattern of a third plurality of bands for which the exposure thereof starts at a timing coincident with the beginning of the exposure interval and ends at a timing before the end of the exposure interval;

a fourth pattern of a fourth plurality of bands, starting from an initial band and ending with a final band, said initial through said final bands of the fourth pattern being exposed consecutively without interruption, the exposure of the bands of the fourth pattern being started at a timing that is delayed with respect to the beginning of the exposure interval yet ends before the end of the exposure interval; and a fifth pattern of a single band for which the exposure thereof starts at a timing coincident with the beginning of the exposure interval and ends at a timing coincident with the end of the exposure interval.

6. A method for writing a pattern on the surface of a substrate by irradiation of a charged particle beam thereon, said surface being defined by a zone extending in a first direction and a plurality of bands that extend in the zone in a second direction perpendicular to said first direction and a plurality of bands that extend in the zone in a second direction perpendicular to said first direction, said pattern being written for each zone by the irradiation of said charged particle beam while moving said substrate in said first direction with a predetermined speed such that said charged particle beam exposes said plurality of bands consecutively and at respective, predetermined irradiation timings, said charged particle beam being deflected in a predetermined exposure region, said method comprising the steps of:

(a) searching for a critical irradiation interval in which said exposure of the charged particle beam is achieved substantially continuously without interruption, said critical irradiation interval starting with the entry of a band into said exposure region and ending with the exit of the band from said exposure region; and (b) adjusting the timing of the exposure for each band, starting from a band exposed immediately before the critical irradiation interval and proceeding in a direction to the first band that is exposed first in the zone, such that the timing of exposure is shifted toward the center of the exposure interval to the extent that the exposure of each of the plurality of bands does not overlap the exposure of the respective, previous band; and (c) repeating said step (b) consecutively for each of the plurality of bands until the respective timing of the exposure of each of the plurality of bands reaches the center of the respectively corresponding exposure interval.

7. A method as claimed in claim 6 in which said method further comprises the steps of:

(d) adjusting the respective timing of exposure for each band, starting from the last band and proceeding in a direction to the critical irradiation interval, such that the respective timing of exposure for each band is shifted toward the center of the corresponding exposure interval to the extent that the exposure of each of the plurality of bands does not overlap the exposure of the respective, previous band; and (e) repeating said step (d) consecutively for each remaining band of the plurality bands until the respective timing of the exposure of each band reaches the center of the corresponding exposure interval.

8. A method for writing a pattern on a surface of an object by a focused electron beam, comprising the steps of:

dividing the surface of the object into a plurality of parallel bands extending in a predetermined direction;

moving the object in a direction perpendicular to the extending direction of the bands and with a predetermined speed; and exposing the pattern on the object, on an individual band by band basis, while moving the object in said direction with said predetermined speed;

said predetermined speed being optimized with respect to a time interval required for exposing each parallel band by conducting an optimization process, said optimization process comprising the steps of:

(a) assuming an initial timing relationship representing a relationship between the timing of the exposure of each band and the position of that band as measured in the moving direction of the object, such that the plurality of bands are exposed, individually and consecutively and from the first band to the last band of the plurality thereof and without interruption;

(b) assuming an initial moving speed of the object;

(c) detecting, based upon the initial timing relationship, a band for which the exposure thereof precedes a predetermined exposure interval, said predetermined exposure interval being defined with respect to each band as a function of the moving speed of the object;

(d) detecting, based upon the initial timing relationship, an offset of timing between the start of the exposure as defined by the initial timing relationship and the beginning of said predetermined exposure interval, for said band detected in the step (c);

(e) modifying the timing relationship by delaying the timing of exposure uniformly by an amount corresponding to said offset for the detected band and the successive bands of the plurality thereof, to create a modified timing relationship that represents the corresponding, modified timing of the exposure of each band of the plurality thereof;

(f) detecting, based upon the modified timing relationship, a band for which the exposure thereof continues after the end of the predetermined exposure interval, starting form the second band and proceeding consecutively to the last band of the plurality thereof;

(g) reducing said predetermined speed, when a band is detected in the step (f), such that said predetermined exposure interval is extended and such that the exposure of said band that is detected in the step (f) is completed within said extended predetermined exposure interval; and (h) repeating said steps (c)–(g) by setting the reduced moving speed as said predetermined speed and by setting said modified timing relationship as said initial timing relationship, until the respective timing of the exposure falls within the predetermined exposure interval for each of the plurality of bands.

* * * * *

UNITED STATES PATENT AND TRADEMARK OFFICE
CERTIFICATE OF CORRECTION

PATENT NO. : 5,194,741
DATED : March 16, 1993
INVENTOR(S) : SAKAMOTO et al.

It is certified that error appears in the above-indentified patent and that said Letters Patent is hereby corrected as shown below:

On the Title Page, item [57] line 9, change "predetermine" to --predetermined--.

Col. 3, line 6, change ",electrostatic" to --electrostatic--.

Col. 9, line 31, after "performed" insert --,--;
line 45, change "lint" to --line--.

Col. 11, line 46, after "line t" insert --and--.

Col. 13, line 26, change "follow" to --follows--;
line 59, after "band" insert --,--.

Col. 14, line 3, after "is" insert --always coincident to the timing S(1) of the exposure--;
line 58, change "belong" to --belongs--.

Col. 18, line 24, after "plurality" insert --of--.

Col. 19, line 7, change "form" to --from--.

Signed and Sealed this

Twelfth Day of July, 1994

Attest:

BRUCE LEHMAN

*Attesting Officer*    *Commissioner of Patents and Trademarks*